(12) United States Patent
Toyoda

(10) Patent No.: US 7,712,203 B2
(45) Date of Patent: May 11, 2010

(54) METHOD OF MANUFACTURING A SENSOR APPARATUS

(75) Inventor: Inao Toyoda, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/320,957

(22) Filed: Feb. 10, 2009

(65) Prior Publication Data

US 2009/0199632 A1   Aug. 13, 2009

(30) Foreign Application Priority Data

Feb. 12, 2008   (JP) .............................. 2008-030319

(51) Int. Cl.
*G01R 3/00*   (2006.01)
(52) U.S. Cl. ....................................................... 29/595
(58) Field of Classification Search .................. 29/595, 29/827, 832, 840, 841, 842; 257/787; 264/272.17; 438/51.118, 127
See application file for complete search history.

(56) References Cited

U.S. PATENT DOCUMENTS

| | | | | |
|---|---|---|---|---|
| 5,377,403 A | * | 1/1995 | Hart et al. ...................... 29/827 |
| 5,424,249 A | * | 6/1995 | Ishibashi ....................... 438/51 |
| 6,061,895 A | * | 5/2000 | Shinjo et al. ................. 29/602.1 |
| 6,751,858 B2 | * | 6/2004 | Tokuhara et al. .............. 29/841 |
| 7,026,548 B2 | * | 4/2006 | Bolken et al. ................. 174/538 |
| 7,195,940 B2 | * | 3/2007 | Bolken et al. ................. 438/25 |
| 7,419,854 B2 | * | 9/2008 | Bolken et al. ................. 438/116 |
| 7,614,135 B2 | * | 11/2009 | Santini et al. ................. 29/595 |
| 2007/0022808 A1 | | 2/2007 | Tanaka et al. |

* cited by examiner

*Primary Examiner*—Jewel Thompson
(74) *Attorney, Agent, or Firm*—Posz Law Group, PLC

(57) ABSTRACT

A sensor apparatus and a method of manufacturing the same are disclosed. The sensor apparatus includes: a sensor chip; a housing receiving the sensor chip; an electric conductive member connected with a terminal of the sensor chip; and a molded member covering a covered portion including a connection portion where the terminal and the electric conductive member are connected. The sensor chip is bonded to a bonding member of the housing via an adhesive member. A surface of the housing, a surface of the adhesive member, and a front surface of the sensor chip are in the same plane at a boundary part of the covered portion.

19 Claims, 15 Drawing Sheets

METHOD OF MANUFACTURING A SENSOR APPARATUS

CROSS REFERENCE TO RELATED APPLICATION

The present application is based on Japanese Patent Applications No. 2008-30319 filed on Feb. 12, 2008, the disclosure of which is incorporated herein by reference.

BACKGROUND OF THE INVENTION

1. Field of the Invention

The present invention relates to a sensor apparatus including an insulating material that covers a terminal for outputting a signal from an exposed sensing member to an external element. The present invention also relate to a method of manufacturing such a sensor apparatus.

2. Description of Related Art

JP-A-2007-33411 corresponding to US Patent Application Publication No. 2007/0022808 proposes a method of manufacturing such a sensor apparatuses that includes an insulating material that covers a terminal for outputting a signal from an exposed sensing member to an external element. According to JP-A-2007-33411, a sensor apparatus is manufactured through: attaching a buffer member made of rubber to a boundary part of a region where a molded member is to cover; deforming the buffering member in closing a mold; and filling a ditch between a sensor chip and a support member to prevent a molding material from leaking toward a sensing member in injection molding.

According to the above method, however, since the buffer member is so tiny, the buffer member and a part to which the buffer member is attached are required to have high dimensional accuracy, and thus, it is difficult to improve a production yield of the sensor apparatus. Further, since the buffer member is required to be attached with high accuracy, it is difficult to improve production efficiency of the sensor apparatus.

SUMMARY OF THE INVENTION

In view of the above and other difficulties, it is an objective of the present invention to provide a sensor apparatus enabling production yield improvement, and to provide a manufacturing method of such a sensor apparatus. It is also an objective of the present invention to provide a sensor apparatus enabling production efficiency improvement, and to provide a manufacturing method of such a sensor apparatus.

According to a first aspect of the present invention, a method of manufacturing a sensor apparatus is provided. The method includes: preparing a sensor chip including a substrate, a sensing member located on the substrate and a terminal located on the substrate, the terminal outputting a signal from the sensing member; and preparing a housing having (i) a first opening on a front surface thereof, (ii) an inner side wall defining a receive space therein communicating with the first opening, and (iii) a bonding member located on an inner bottom surface of the housing at a boundary part of a predetermined portion. The inner bottom surface defines a bottom of the receive space, and a depth defined between the first opening and the bonding member is deeper compared to a thickness of the sensor chip. The method further includes: placing an adhesive member on one of the bonding member and a back surface of the sensor chip; and placing the sensor chip in the receive space through the first opening so that the sensing member is exposed. The placing of the sensor chip includes placing the back surface of the sensor chip on the bonding member via the adhesive member to form a clearance between a side surface of the sensor chip and the inner side wall of the housing. The method further includes pressing the front surface of the sensor chip whose back surface is placed on the bonding member, so that: the sensor chip and the housing push the adhesive member to the clearance; and the front surface of the sensor chip, the front surface of the housing and a surface of a part of the adhesive member pushed in the clearance are in a same plane at the boundary part. The method further includes: electrically connecting the terminal to an electrical conductive member, the electrical conductive member to be electrically connected to an external element; and forming, by injection molding, a molded member that covers the predetermined portion including a connection part where the terminal and the electric conductive member are connected with each other. The forming of the molded member includes: closing a mold receiving the sensor chip, the housing and the electric conductive member, after the pressing of the front surface of the sensor chip and the electrically connecting of the terminal; and injecting a molding material in the mold.

According to the above method, in the forming of the molded member covering the predetermined portion by injection molding, there is not a gap, at the boundary part of the predetermined portion, between: the mold; and the front surface of the sensor chip, the surface of the part of the adhesive member and the front surface of the housing. Thus, it is possible to prevent the molding material from leaking to an outside of the predetermined portion. Accordingly, it is possible to improve a production yield and production efficiency of the sensor apparatus.

According to a first aspect of the present invention, a method of manufacturing a sensor apparatus is provided. The method includes: preparing a sensor chip including a substrate, a sensing member located on the substrate and a terminal located on the substrate, the terminal outputting a signal from the sensing member; preparing a housing having (i) a first opening on a front surface of the housing, (ii) an inner side wall defining a receive space therein communicating with the first opening, and (iii) a bonding member located on an inner bottom surface of the housing at a boundary part of a predetermined portion. The inner bottom surface defines a bottom of the receive space, and a depth defined between the first opening and the bonding member is deeper compared to a thickness of the sensor chip. The method further includes: placing an adhesive member on one of the bonding member and a back surface of the sensor chip; and placing the sensor chip in the receive space through the first opening so that the sensing member is exposed. The placing of the sensor chip includes: placing the back surface of the sensor chip on the bonding member via the adhesive member to form a clearance between a side surface of the sensor chip and the inner side wall of the housing. The method further includes: pressing the front surface of the sensor chip whose back surface is placed on the bonding member, so that the sensor chip and the housing push the adhesive member to the clearance; electrically connecting the terminal to an electrical conductive member, the electrical conductive member to be electrically connected to an external element; placing a film on the front surface of the sensor chip and the front surface of the housing so that the film covers the boundary part of the predetermined portion, after the pressing of the front surface of the sensor chip and the electrically connecting of the terminal; and forming, by injection molding, a molded member that covers the predetermined portion including a connection part where the terminal and the electric conductive member are connected with each other. The forming of the molded member includes: closing a mold receiving the sensor chip, the housing and the electric conductive member, after the pressing of the front surface of the sensor chip and the electrically connecting of the terminal; and injecting a molding material in the mold.

According to the above method, even if the front surface of the sensor chip or the front surface of the housing has irregularities at the boundary part, the irregularities is filled with the film. Therefore, in the forming of the molded member covering the predetermined portion by injection molding, there is not a gap, at the boundary part of the predetermined portion, between: the mold; and the front surface of the sensor chip, the surface of the part of the adhesive member and the front surface of the housing. Thus, it is possible to prevent the molding material from leaking to an outside of the predetermined portion. Accordingly, it is possible to improve a production yield and production efficiency of the sensor apparatus.

According to a third aspect of the present invention, a sensor apparatus is provided. The sensor apparatus includes a sensor chip, a housing, an electric conductive member and a molded member. The sensor chip includes a substrate, a sensing member located on the substrate, and a terminal located on the substrate. The housing receives the sensor chip with the sensing member of the sensor chip being exposed. The electric conductive member is electrically connected with the terminal and to be electrically connected with an external element. The molded member covering a covered portion includes a connection portion where the terminal and the electric conductive member are connected with each other. The housing has a first opening on a front surface thereof. The housing defines a receive space therein (i) communicating with the first opening and (ii) receiving the sensor chip through the first opening while the housing and a side surface of the sensor chip define a clearance therebetween. The housing further has a bonding member. The bonding member is located on an inner bottom surface of the housing at a place corresponding to a boundary part of the covered portion, the inner bottom surface defining a bottom of the receive space. The bonding member is bonded to a back surface of the sensor chip via an adhesive member. The first opening and the bonding member define therebetween a depth, the depth being deeper compared to a thickness of the sensor chip. A part of the adhesive member is located in the clearance by being pressed and pushed out by the sensor chip and the housing. The front surface of the housing, a surface of the part of the adhesive member, and a front surface of the sensor chip are in a same plane at the boundary part.

According to the above sensor apparatus, in the forming of the molded member covering the covered portion by injection molding, there is not a gap, at the boundary part of the covered portion, between: a mold; and the front surface of the sensor chip, the surface of the part of the adhesive member and the front surface of the housing. Thus, it is possible to prevent a molding material from leaking to an outside of the covered portion. Accordingly, it is possible to improve a production yield and production efficiency of the sensor apparatus.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EXEMPLARY EMBODIMENTS

Exemplary Embodiment

An exemplary embodiment is described below with reference to the accompanying drawings. In the followings, as an example of a sensor apparatus, a heat type flow amount sensor apparatus is explained.

Figure 1A:
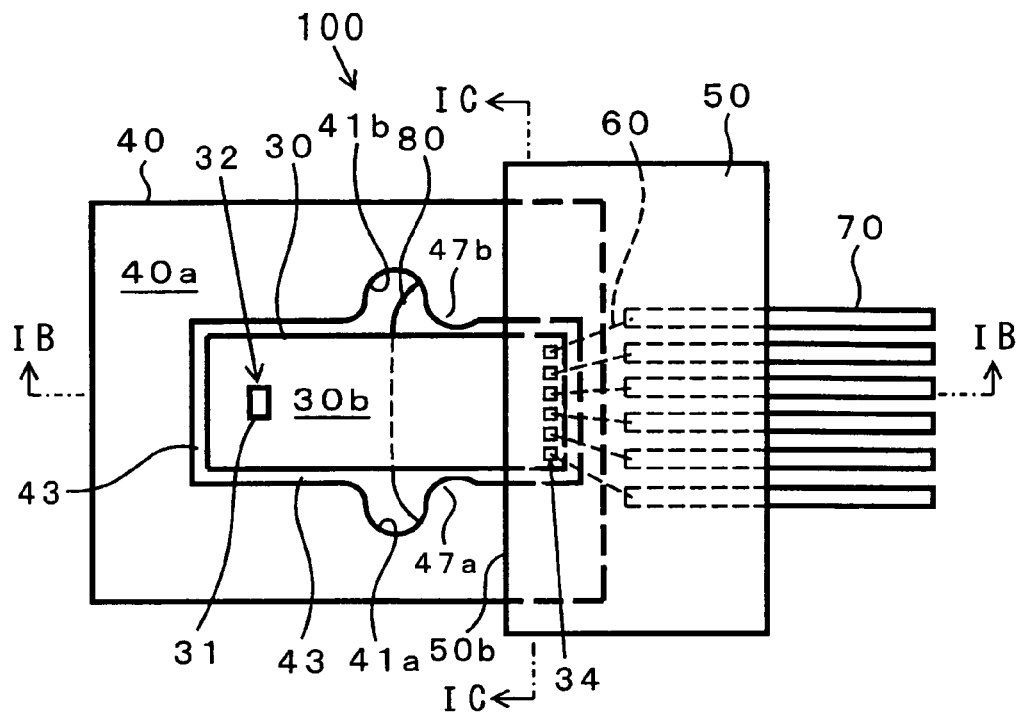
FIG. 1A is a plan view diagram illustrating a heat type flow amount sensor apparatus in accordance with an exemplary embodiment.

There will be described below a heat type flow amount sensor apparatus 100 with reference to FIGS. 1A to 1C. A heat type flow amount sensor apparatus 100 includes a sensor chip 30 for detecting a flow amount of air, a housing 40 for receiving the sensor chip 30, multiple wires 60, multiple leads 70, and a molded member 50. The multiple wires 60 are electrically connected with the sensor chip 30 by wire bonding and function as an electric conductive member. The multiple leads 70 are electrically connected to the multiple wires 60, respectively. The molded member 50 is formed by molding using a molding material, and covers a connection part where the multiple lead 70 and the multiple wire are connected with each other. Alternatively, the multiple leads 70 may be an external element 70.

Figure 2A:
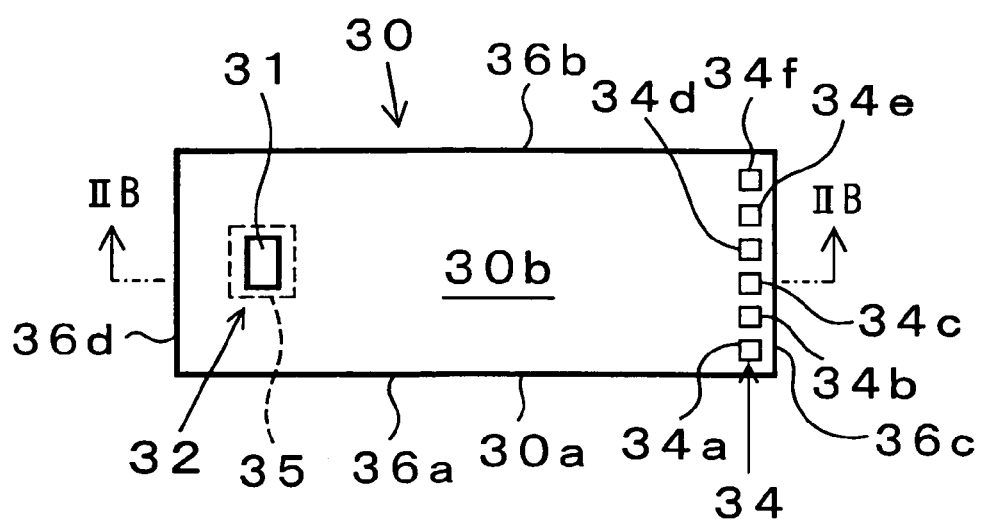
FIG. 2A is a plan view diagram illustrating a sensor chip of a heat type flow amount sensor apparatus exemplified in FIG. 1A.
Figure 2B:
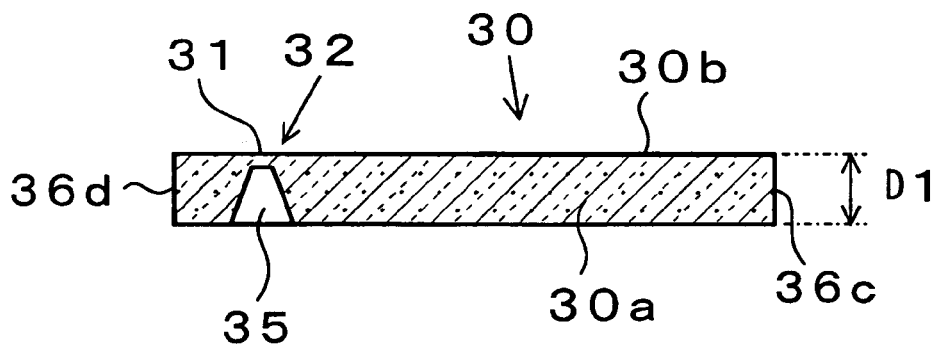
FIG. 2B is a cross sectional diagram taken along line IIB-IIB of FIG. 2A.

As shown in FIGS. 2A and 2B, the sensor chip 30 is formed using a semiconductor substrate 30a and formed in a thin-walled plate shape. The sensor chip 30 includes a sensing member 32 for sensing a flow amount of air. The sensing member 32 is located on a front surface 30b of the semiconductor substrate 30a and located near a side surface 36d (i.e., a fourth side surface) of the sensor chip 30. The sensor chip 30 further includes multiple pads 34 that function as a terminal 34. The multiple pad 34 are located on the front surface 30b, located near a side surface 36c (i.e., a third side surface) of the sensor chip 30, and aligned along the side surface 36c. Hereinafter, a side surface 36d side is also referred on a first end side, and a side surface 36c side is also referred on a second end side.

The pads 34 are electrically connected with the leads 70 through the wires 60, respectively. The leads 70 are electrically connected to a control circuit (not shown) which performs a control operation based on a signal from the sensing member 32. The sensing member 32 has a cavity 35 on a back surface thereof. The sensing member 32 includes a membrane member 31 having a thin insulating film on a surface defining the cavity 35.

In the present embodiment, a silicon substrate 30a is used as the semiconductor substrate 30a since an insulating layer or a conductive layer can be easily formed and processed. Further, the cavity 35 is formed through etching the back surface of the semiconductor substrate 30a, and thereby to form the membrane member 31, since processing can be easily performed. Further, the molded member 50 is formed through injection molding with epoxy resin, taking into account high dimensional stability, high resistance to water and chemical, and high electric insulation. Further, the housing 40 is formed through processing (e.g., etching) the same material as that used for the leads 70, since it becomes possible to improve production efficiency.

Figure 3A:
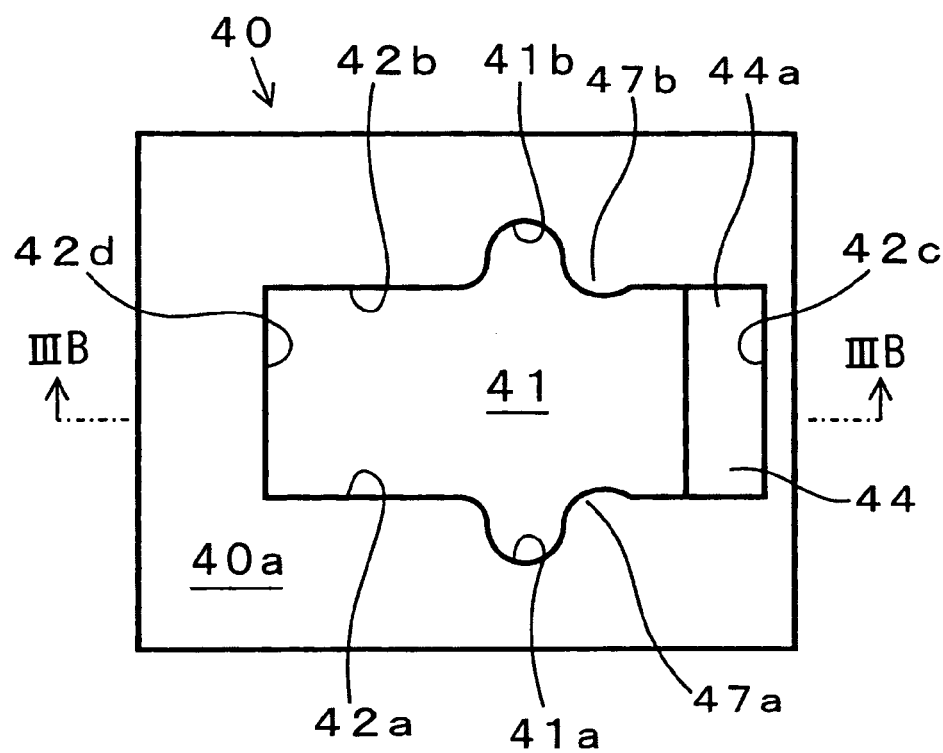
FIG. 3A is a plan view diagram illustrating a housing of a heat type flow amount sensor apparatus exemplified in FIG. 1A.
Figure 3B:
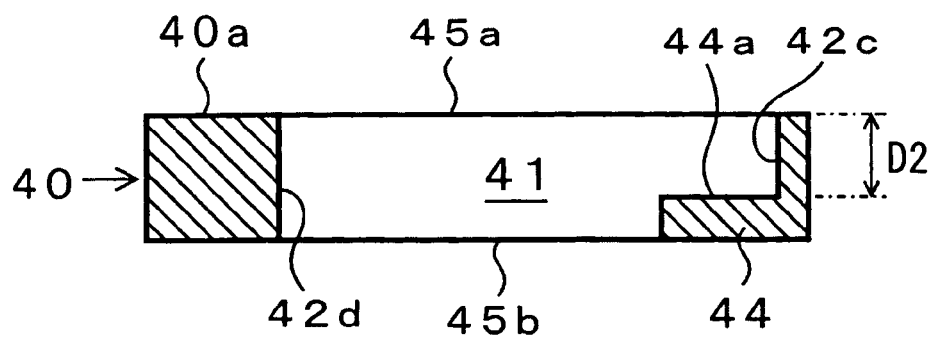
FIG. 3B is a cross sectional diagram taken along line IIIB-IIIB of FIG. 3A.

As shown in FIG. 3A, the housing 40 is formed in a generally frame shape and defines a receive space 41 (i.e., receive portion 41) for receiving the sensor chip 30. An opening 45a (i.e., a first opening) is formed on a front surface of the housing 40. Another opening 45b (i.e., a second opening) is formed on a back surface of the housing. The openings 45a, 45b are in communication with the receive space 41. The housing 40 has a bonding member 44 located on a part of the bottom of the receive space 41 on the second end side. The bonding member 44 is bonded to a part of the back surface of the sensor chip 30 on the second end side.

The bonding member 44 extends from a lower part of an inner side wall 42c, which is located on the second end side, of the housing 40 toward the first end side of the housing 40. A surface 44a of the bonding member 44 is formed in a shape corresponding to the part of the back surface of the sensor chip 30 on the second end side.

Figure 1B:
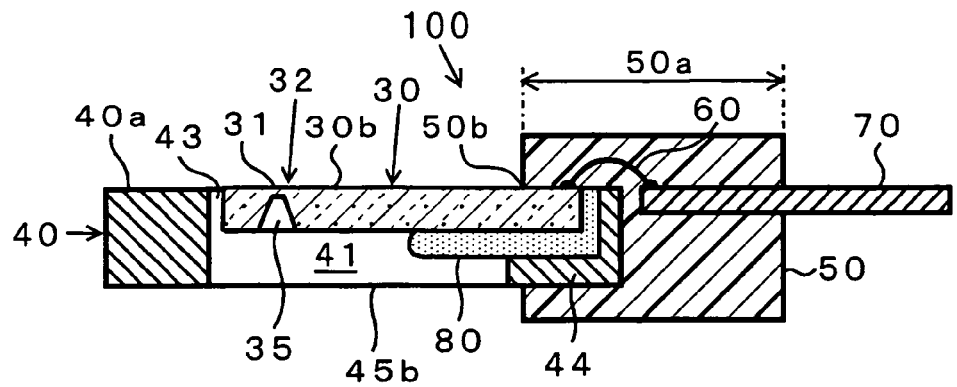
FIG. 1B is a cross sectional diagram taken along line IB-IB of FIG. 1A.

That is, as shown in FIG. 1B, the sensor chip 30 is received in the receive space 41. The part of the back surface of the sensor chip 30 on the second end side is bonded to the surface 44a of the bonding member 44 using an adhesive member 80. The sensor chip 30 is cantilevered in the receive space 41; a bonded end of the sensor chip 30 is supported and the other end is a free end.

Accordingly, it becomes possible to reduce a bonded area. Thus, even if there exists a difference in coefficient of thermal expansion between the sensor chip 30 and the bonding member 44, a thermal stress acting on the sensor chip 30 becomes small, and as a result, it is possible to suppress warpage, strain, and crack in the sensor chip 30.

Thus, it is possible to prevent the disordering of air conducting around the sensing member 32, thereby to restrict reduction of detection accuracy for a flow amount of air. Further, it is possible to prevent generation of a piezoresistance effect resulting form the warpage or strain of the sensor chip 30, thereby to prevent reduction of detection accuracy of a flow amount of air.

A depth "D2" from an upper end of the opening 45a to the surface 44a of the bonding member 44 is designed deeper compared to a thickness "D1" of the sensor chip 30. The depth "D2" is designed such that, when the part of the back surface of the sensor chip 30 on the second end side is placed on the surface 44a of the bonding member 44 via the adhesive member (referred by the reference numeral 80 in FIG. 1A to 1C), the front surface of the sensor chip 30 projects from or positioned above the front surface of the housing 40.

Figure 1C:
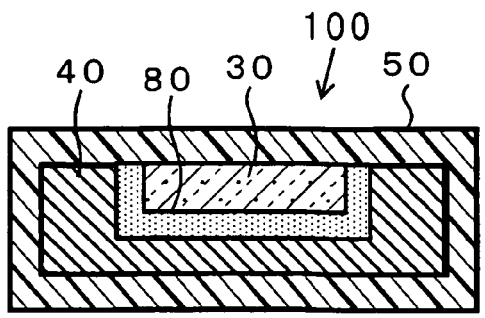
FIG. 1C is a cross sectional diagram taken along line IC-IC of FIG. 1A.

Further, as shown in FIGS. 1B and 1C, the depth "D2" is designed such that, when the adhesive member 80 placed on the surface 44a of the adhesive member 80 is pressed and deformed through pressing the front surface of the sensor chip 30, the front surface of the sensor chip 30 and the front surface of the housing 40 can become in the same plane.

Figure 4:
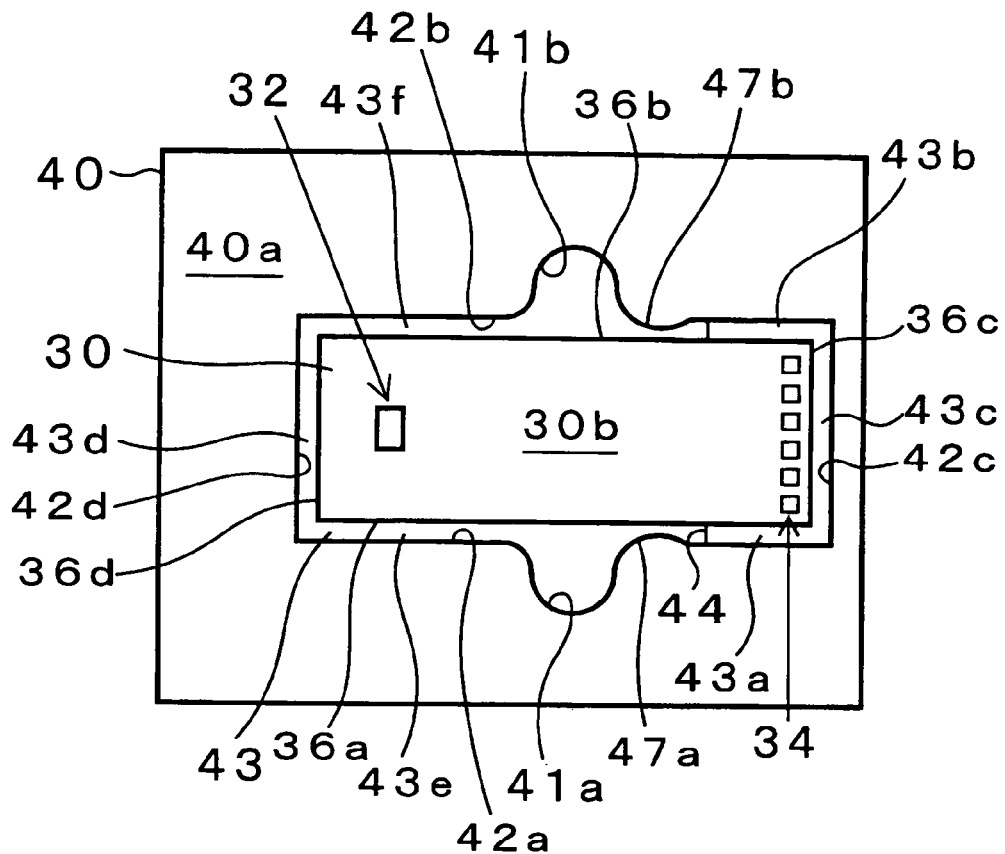
FIG. 4 is a plan view diagram illustrating a sensor chip and a housing which define a clearance therebetween.

The receive space 41 is formed to have such a size that the sensor chip 30 can be accommodated in the receive space 41 through the opening 45a while the back surface of the sensor chip 30 is being directed to the bonding member 44. As shown in FIG. 4, the receive space 41 has a size such that a clearance is formed between an inner side wall of the housing defining the receive space 41 and a side surface of the sensor chip 30 received in the receive space.

A clearance 43a is formed between a first part of a side surface 36a of the sensor chip 30 and a first part of an inner side wall 42a of the housing 40, which face each other. The side surface 36a is generally parallel to a longer side direction of the sensor chip 30. The first part of the side surface 36a is located closer to the pad 34 than the other part of the side surface 36a is, and, the first part of the side surface 36a extends to the bonding member 44.

A clearance 43b is formed between a first part of a side surface 36b of the sensor chip 30 and a first part of an inner side wall 42b of the housing 40, which face each other. The side surface 36a and the side surface 36b of the sensor chip 30 are positioned opposite to each other. The first part of the side surface 36b is located closer to the pad 34 than the other part of the side surface 36b is. Also, the first part of the side surface 36b extends to the bonding member 44.

A clearance 43e is formed between a second part of the side surface 36a of the sensor chip 30 and a second part of the inner side wall 42a of the housing 40, which face each other. The second part of the side surface 36a is located closer to the sensing member 32 than the first part of the side surface 36a is.

A clearance 43f is formed between a second part of the side surface 36b of the sensor chip 30 and a second part of the inner side wall 42b of the housing 40, which face each other. The second part of the side surface 36b is located closer to the sensing member 32 than the first part of the side surface 36b is.

Another clearance 43c is formed between a side surface 36c of the sensor chip 30 and an inner side wall 42c of the housing 40, which face each other. The side surface 36c is located on a pad 34 side.

Another clearance 43d is formed between a side surface 36d of the sensor chip 30 and an inner side wall 42d of the housing 40, which face each other. The side surface 36d is located on a sensing member 32 side.

A relief portion 41a (i.e., an in-flow portion 41a) is formed between the side surface 36a of the sensor chip 30 and the inner side wall 42a of the housing 40, which face each other. A relief portion 41b (i.e., an in-flow portion 41b) is formed between the side surface 36b of the sensor chip 30 and the inner side wall 42b of the housing 40, which face each other. The relief portions 41a, 41b are designed so that the adhesive member 80 can flow into the relief portions 41a, 41b. The side surfaces 36a, 36b of are continuously connected with two ends of the side surface 36c, which is located on a pad 34 side. In other words, the relief portions 41a, 41b are respectively formed on the inner side walls 42a, 42b, each of which extends across a boundary part 50b of a covered portion 50a of the molded member 50 (see FIG. 1A).

The relief portion 41a, 41b provides a space for receiving the adhesive member 80 that is pushed out to the clearance 43, when the front surface 30b of the sensor chip 30 is pressed, by a back surface of the second end part of the sensor chip 30 and the surface 44a of the bonding member 44. The relief portions 41a, 41b are formed at positions so as to prevent the adhesive member 80 flowing into the clearance 43 from reaching to the vicinity of the sensing member 32. Further, the relief portions 41a, 41b are formed to have volumes enough to prevent the extra adhesive member 80 flowing into the clearance 43 from flowing to the vicinity of the sensing member 32 via the relief portions 41a, 41b.

The relief portions 41a, 41b are respectively formed and defined by concaved surfaces of the inner side walls 42a, 42b. In an example shown in FIG. 1A, the adhesive member 80 that had flowed in the clearance 43 partially exists in the relief portions 41a, 41b. As shown in FIG. 1B, the adhesive member 80 projects from an end face of the bonding member 44. In the present embodiment, the inner side wall defining each relief portion 41a, 41b has a circular arc shape in a plan view. The relief portions 41a, 41b are located symmetrically with respect to the receive space 41.

A throttle portion 47a is formed on the inner side wall 42a of the housing 40, located between the clearance 43a and the relief portion 41a, and located adjacent to the relief portion 41a. A throttle 47b is formed between the clearance 43b and the relief portion 41b, and located adjacent to the relief portion 41b. That is, the throttle portions 47a, 47b are respectively formed in conduction path of the adhesive member 80 from the clearances 43a, 43b to the relief portions 41a, 41b.

The throttle portions 47a, 47b can throttle flows of the adhesive member 80 from the clearances 43a, 43b toward the relief portions 41a, 41b, respectively. That is, the throttle portion 47a, 47b limits a flow of the adhesive member 80 to reduce an amount of the adhesive member 80 flowing to the relief portion 41a, 41b, and thereby to increase an amount of the adhesive member 80 flowing to the clearances 43a, 43b, 43c. Thereby, the adhesive member 80 can move upward in the clearances 43a, 43b, 43c, and can reach upper ends of the clearances 43a, 43b, 43c.

The throttle portion 47a, 47b can also function as a positioning member for positioning the sensor chip 30 when the sensor chip 30 is accommodated in the receive space 41. By placing the sensor chip 30 in receive space 41 with reference to the throttle portions 47a, 47b, it is possible to reduce a positioning error of a width of each clearance 43a, 43b, 43c. In the present embodiment, the inner side wall of the housing 40 defining each of the throttle portions 47a, 47b projects toward an inside of the receive space 41, and has a circular arc shape in a plan view. The inner side walls defining the throttle portions 47a, 47b are located symmetrically with respect to the receive space 41.

The adhesive member 80 used has such a volume that, when the adhesive member 80 is pushed out by the part of the back surface of the sensor chip 30 on the second end and the surface 44a of the bonding member 44, the adhesive member 80 reaches an upper end of each clearance 43a, 43b, 43c, which are adjacent to the covered portion 50a. That is, when the sensor chip 30 is pressed using a pressing apparatus in a pressing step of manufacturing, a surface of the sensor chip 30, a surface of the housing 40, and a surface of the adhesive member 80 in each clearances 43a, 43b, 43c become in the same plane at the boundary part 50b of the covered portion 50a (see FIGS. 1B and 1C).

That is, the surfaces of the sensor chip 30, the housing 40, and the adhesive member 80 in each clearance 43a, 43b, 43c are prevented from forming a step at the boundary part 50b. Accordingly, when the molded member 50 is formed by injection molding through injecting a molding material toward the covered portion 50a, it is possible to prevent formation of a clearance between: a lower surface of a mold used in molding; and the surfaces of the sensor chip 30, the housing 40, and the adhesive member 80. As a result, the molding material may not be leaked from the clearance, and the leaked molding material may not be attached to the sensor chip 30 or a surface of the housing 40. Therefore, a buffer member that is conventionally used is not necessary, and thus, it is possible improve a production yield of the heat type flow amount sensor apparatus 100. It is also possible to improve production efficiency.

In the present embodiment, an adhesive member having a film shape is used as an adhesive member since control of a volume, a size and a shape is easy and since positioning on a bonding area is easy. For example, a non-conductive film (NCF) made of epoxy resin may be used as an adhesive member having a film shape since the NCF has a high rate of thermal hardening and an insulating property. The NCF has an adhesive layer on a bonding plane, and the adhesive layer is soft under ambient temperatures and becomes hard when temperature reaches a curing temperature.

As shown in FIG. 1B, in a portion other than the covered portion 50a, a surface of the sensor chip 30 and a surface of the housing 40 are also in the same plane. Thus, air flowing around the sensing member 32 may not be disordered. As a result, it is possible improve detection accuracy of a flow amount of air.

There will be described below a sensor chip 30 with reference to FIG. 5.

Heaters 32a, 32b are formed on the membrane member 31 of the sensor chip 30. The heater 32a is located on an upstream side of an air flow, which is shown as the outline arrow "F1" in FIG. 5. The heater 32b is located on a downstream side of the air flow. The membrane member 31 and the pair of heaters 32a, 32b are components of the sensing member 32. The sensor chip 30 further includes temperature sensors 37a, 37b and a resistive element including wiring layers 33a to 33f. The temperature sensor 37a, 37b senses an ambient temperature of the heat type flow amount sensor apparatus 100.

Since the membrane member 31 is much thinner than the semiconductor substrate 30a, the membrane member 31 has a small heat capacity, and thermal insulation of the membrane member 31 from the semiconductor substrate 30a is ensured. Further, since the heaters 32a, 32b are formed on the membrane member 31, the sensing member 32 has a high sensitivity.

In the present embodiment, an insulating film is formed on a surface of the silicon substrate. The insulating film is, for example, a silicon nitride film or a silicon oxide film. On a surface of the insulating film, a semiconductor layer that is formed through thermal diffusion of impurities in a silicon layer is patterned. By using the semiconductor layer, the heaters 32a, 32b, the temperature sensors 37a, 37b and the resistive element including the wiring layers 33a to 33f are formed.

That is, an SOI substrate is used to provide the silicon substrate, the insulating film and the semiconductor layer. The SOI substrate has a support substrate as the silicon substrate, an buried oxide layer (BOX layer) as the insulating film, and a SOI layer as the semiconductor layer.

The semiconductor layer is covered by an insulating film made of, for example, a boron-doped phospho-silicate glass (BPSG) layer. The semiconductor layer is electrically connected with the pads 34a to 34f through contact holes formed at predetermined positions of the insulating film. The pads 34a to 34f are made of, for example, aluminum.

A silicon nitride film is formed on a surface of the insulating film so as to cover a generally whole of the silicon substrate, thereby to protect a surface of the sensor chip 30. Openings are formed on the silicon nitride film at positions that respectively correspond to the pads 34a to 34f. Through the openings, the pads 34a to 34f are connected to the wires 60 by wire bonding, and thereby, the pads 34a to 34f are electrically connected with the leads 70.

There will be described below an operation of a heat type flow amount sensor apparatus. The heaters 32a, 32b are driven by a control circuit (not shown) that is electrically connected with the leads 70. For example, the control circuit controls the heaters 32a, 32b so that temperatures of the heaters 32a, 32b become higher than an ambient temperature by 200 degrees C. In the above, the ambient temperature is sensed by the temperature sensors 37a, 37b. More specifically, an electric current flows from the control circuit to the heater 32a via the pads 34b, 34c and the wiring layers 33b, 33c, and an electric current flows from the control circuit to the heater 32b via the pads 34d, 34e and the wiring layers 33d, 33e. Thereby, each heater 32a, 32b having a predetermined line width is heated, and temperatures of the heaters 32a, 32b increase accordingly.

In the above, the heat is radiated from the heaters 32a, 32b to an air flow. An amount of the heat radiated from the heaters 32a, 32b depends on a flow amount of air. The control circuit adjusts the electric current so that temperature of the heaters 32a, 32b is constant. In the above adjustment, a variation in the electric current is acquired as a signal, and the flow amount of air is calculated based on the signal. Further, depending on a direction of the air flow, there arises a difference between the heat radiated from one of the heaters 32a, 32b and that radiated from the other of the heaters 32a, 32b. The heater 32a located at the upstream side radiates much more heat and requires much more electric current, compared to the heater 32b located at the downstream side. Based on this difference, it is possible to sense the direction of the air flow as well as a flow amount of air. The temperature sensors 37a, 37b are used for sensing an ambient temperature, which is used as a reference.

Figure 5:
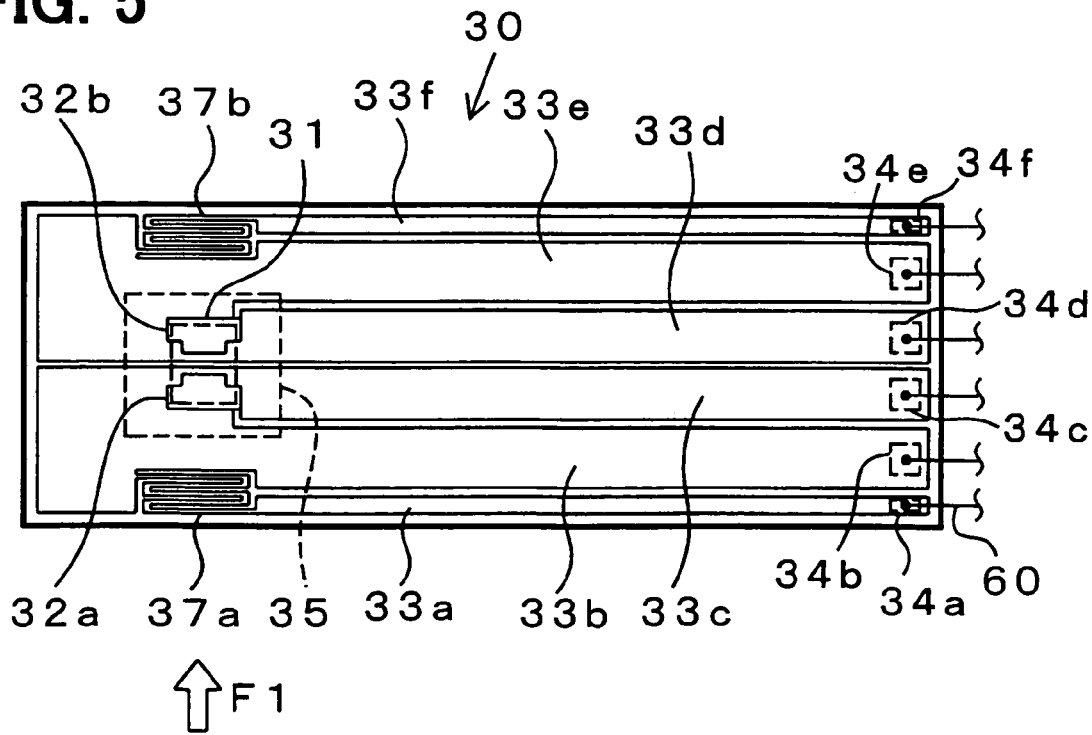
FIG. 5 is a plan view diagram illustrating a sensor chip.
Figure 6:
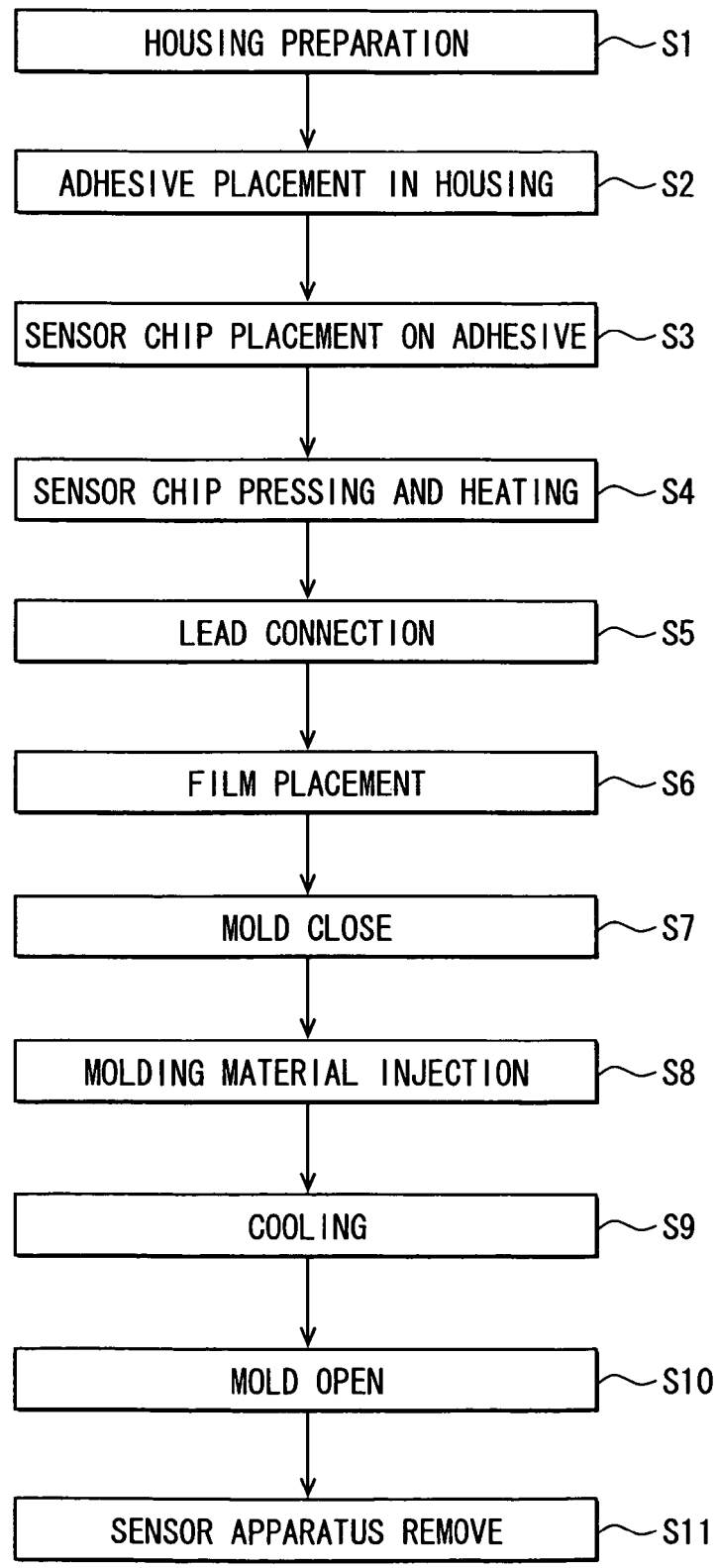
FIG. 6 is a process chart illustrating a manufacturing flow.

Here, the direction of air flow is assumed to be that shown as the outline arrow "F1" in FIG. 5. In this situation, since the heater 32a radiates much heat as described above, the control circuit increases electric conduction to the heater 32a to maintain temperature or resistance of the heater 32a at a constant value. Since the air heated by the heater 32a passes over the heater 32b, the heat radiated from the heater 32b becomes small, and the control circuit reduces electric conduction to the heater 32b. Based on an amount of the electric conduction to the heater 32a and that to the heater 32b, it becomes possible to detect an flow amount of air and a direction of air flow.

The heater 32a, 32b includes heat generating resistance element, and also functions as a temperature sensitive resistance element. That is, the heater 32a, 32b maintains the resistance thereof at a constant value with interaction between the temperature and the resistance of the heater 32a, 32b. Thus, if the resistance is changed due to stress in the sensor chip 30 (an effect known as a piezoresistance effect), it becomes difficult to properly maintain the temperature and the piezoresistance effect can be a factor for error. However, as described above, according to the present embodiment, the piezoresistance effect is negligible since: the part of the sensor chip 30 on the second end side is bonded and fixed to the housing 40; a part other than the bonded portion is exposed in the receive space 41; and the exposed part are not in contact with any member. It is therefore possible to detect a flow amount with high accuracy.

There will be described below a method of manufacturing the above heat type flow amount sensor apparatus 100 with reference to the drawings.

Figure 7A:
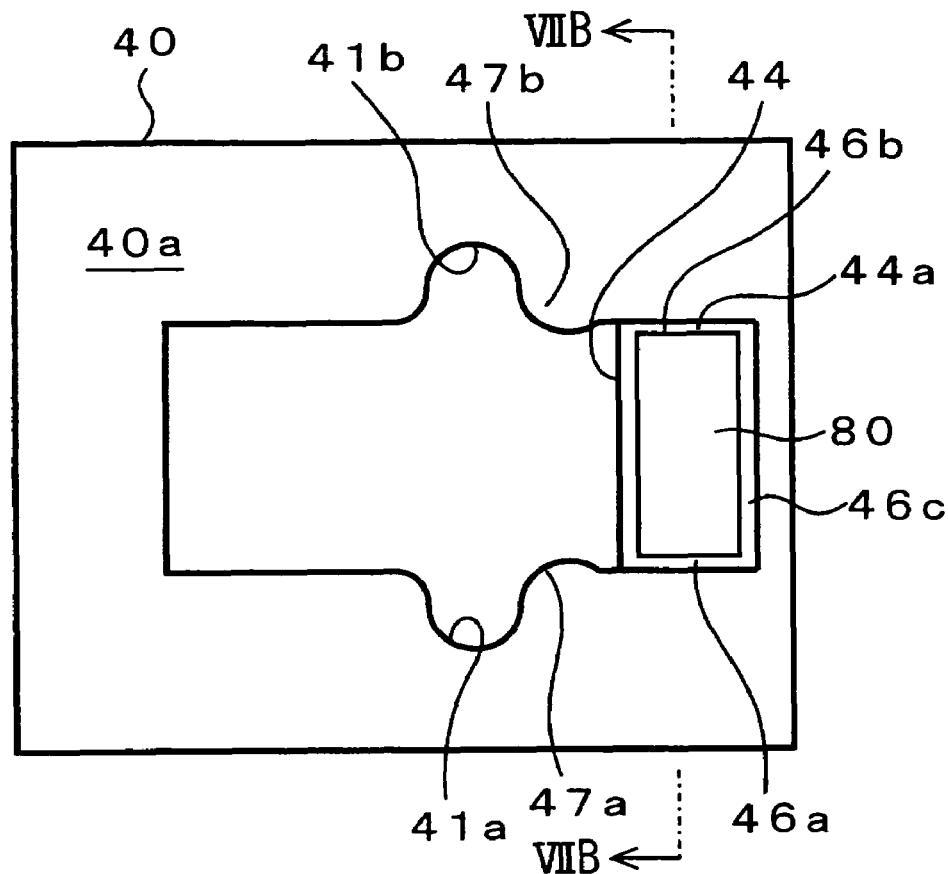
FIG. 7A is a plan view diagram corresponding to S3 in FIG. 6 and illustrating a housing in which an adhesive member is placed.
Figure 7B:
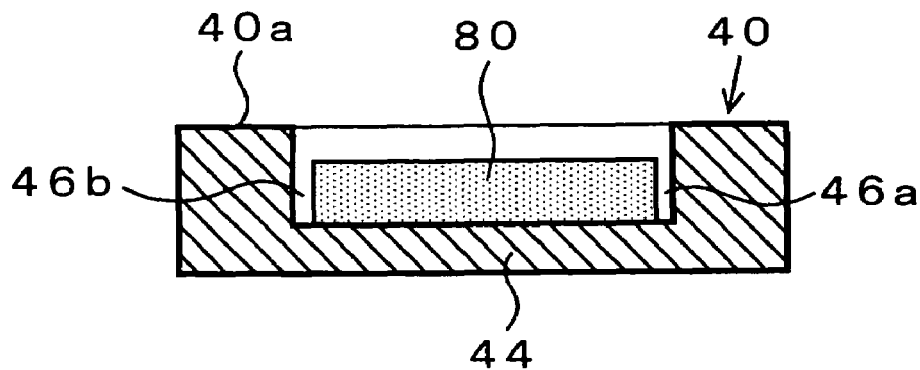
FIG. 7B is a cross sectional diagram taken along line VIIB-VIIB in FIG. 7A.

At S1, the above-described housing 40 is prepared. At S2, an adhesive member 80 is placed on a surface 44a of a bonding member 44 of the housing 40 prepared at S1, as shown in FIGS. 7A and 7B. In the present embodiment, the adhesive member 80 is placed on the surface 44a of the bonding member 44 by using, for example, a collet, which is used for placing an IC chip on a printed circuit board. An area of the adhesive member 80 is formed smaller than an area of the surface 44a. Further, the adhesive member 80 is placed on the surface 44a of the bonding member 44 so that the adhesive member 80 and the inner side walls 42a, 42b, 42c of the housing 40 define clearances 46a, 46b, 46c therebetween.

In the above, the adhesive member 80 is placed so that the clearances, which are defined between the adhesive member 80 and the inner side walls 42a, 42b, 42c, have a generally same width. In other words, the clearances is formed so that the clearances 43a, 43b, 43c will be evenly filled with the adhesive member 80 when the front surface 30b of the sensor chip 30 is pressed in a later process S4.

Figure 8A:
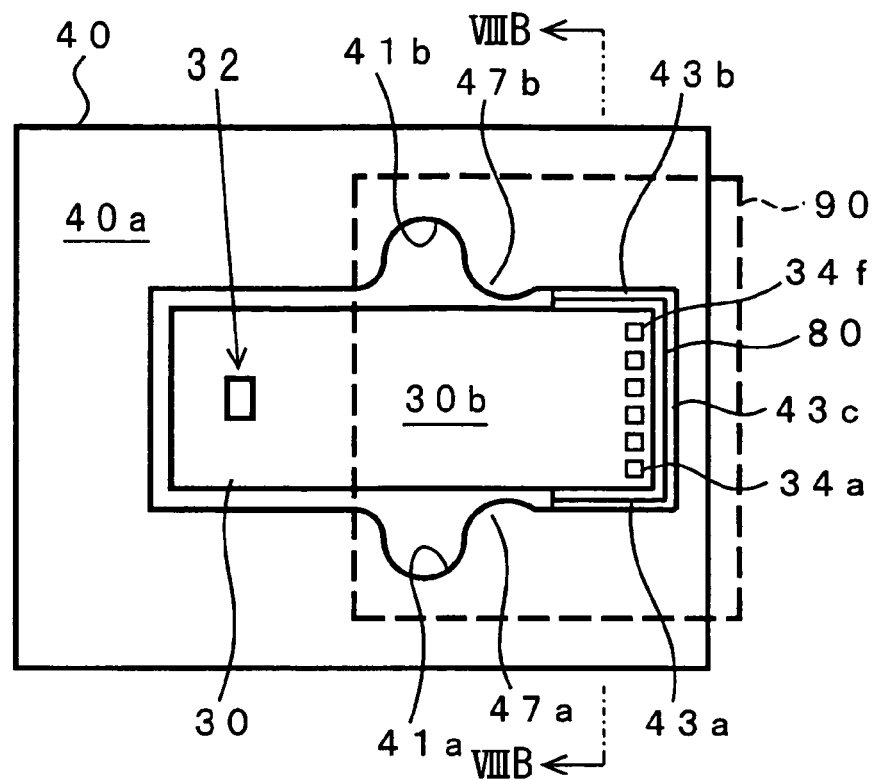
FIG. 8A is a plan view diagram corresponding to S3 and S4 in FIG. 6 and illustrating the pressing of a sensor chip by a pressing member.
Figure 8B:
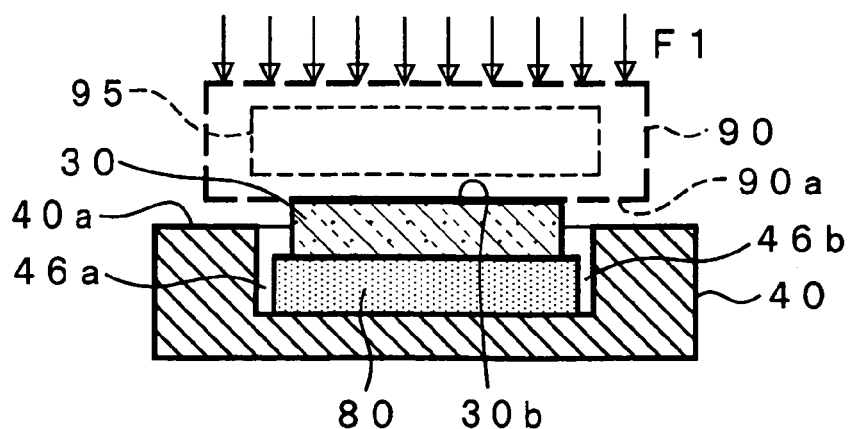
FIG. 8B is a cross sectional diagram taken along line VIIIB-VIIIB in FIG. 8A.

At S3, as shown in FIGS. 8A and 8B, the sensor chip 30 is placed on the adhesive member 80 that is placed on the surface 44a of the bonding member 44. More specifically, the sensor chip 30 is placed so that a part of the back surface of the sensor chip 30 on a pad (34a to 34f) side is bonded to the adhesive member 80. In the above, it is possible to easily position the sensor chip 30 in the receive space 41 by using a throttle portion 47a, 47b (which functions as a positioning portion as described) as a mark to determine a position of the sensor chip 30. Further, it is possible to reduce an error of the width of each clearance 43a, 43b, 43c.

At S4, the front surface of the sensor chip is pressed. As shown in FIG. 8B, a pressing apparatus for pressing the front surface of the sensor chip 30 includes a pressing member 90. The pressing member 90 has a built-in heater 95, and a flat pressing surface 90a on a lower surface thereof. The pressing surface 90a is made of a material that the adhesive member 80 is hard to be attached to. In the present embodiment, the pressing member 90 is made of, for example, metal, resin, ceramic or the like. Further, a surface of the pressing member corresponding to the pressing surface is coated by Teflon (registered trademark). Alternatively, the pressing member may be made of Teflon.

Figure 9A:
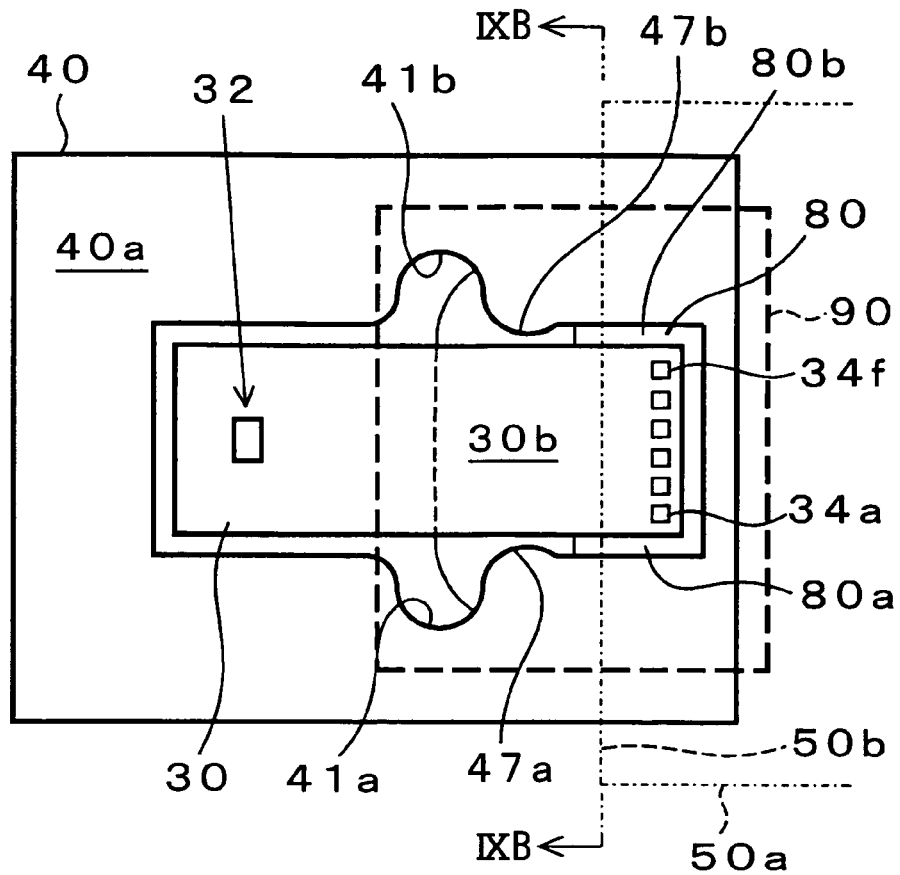
FIG. 9A is a plan view diagram corresponding to S4 in FIG. 6 and illustrating a state where a sensor chip is pressed by a pressing member.

As shown in FIG. 8B, the front surface 30b of the sensor chip 30 placed on the bonding member 44 projects from the front surface of the housing 40. When the front surface 30b of the sensor chip 30 is pressed by the pressing member 90, the adhesive member 80 is pressed and deformed by the back surface of the sensor chip 30 and the surface 44a of the bonding member 44. The pushed and deformed adhesive member 80 partially flows into the clearances 43a, 43b, 43c and moves upward in each clearance 43a, 43b, 43c. Then, as shown in FIGS. 9A and 9B, the pressing is stopped when the pressing surface 90a of the pressing member 90 contacts the front surface 40a of the housing 40.

Figure 9B:
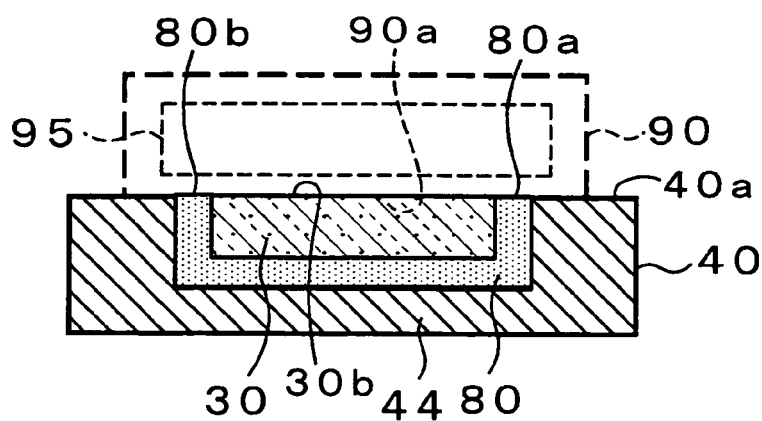
FIG. 9B is a cross sectional diagram taken along line IXB-IXB in FIG. 9A.

FIG. 9B is a cross sectional taken along line in a thickness direction of the sensor chip 30, the line passing through the boundary part 50b of the covered portion 50a. As shown in FIG. 9B, the following surfaces are in the same plane: the front surface 30b of the sensor chip 30; the front surface 40a of the housing 40; the surface 80a of the adhesive member 80 that is located in the clearance 43a; the surface 80b of the adhesive member 80 that is located in the clearance 43b; and the surface of the adhesive member 80 that is located in the clearance 43c. That is, at the boundary part 50b of the covered portion 50a, the surfaces of the sensor chip 30, the housing 40 and the adhesive member 80 are in the same plane and do not have a step. Although a part of the adhesive member flowing into the clearances 43a, 43b, 43c further flows toward the sensing member 32, the throttle portions 47a, 47b restricts the flow toward the sensing member 32 en route to the sensing member 32.

As a result, a large part of the adhesive member 80 flows in the clearances 43a, 43b, 43c, and reaches an upper end of each clearance 43a, 43b, 43c. When the clearances 43a, 43b, 43c are filled with the adhesive member 80, the adhesive member 80 may spread beyond the throttle portions 47a, 47b. In such a case, the adhesive member 80 spreading beyond the throttle portions 47a, 47b flows in and are trapped in the relief portions 41a, 41b. The adhesive member 80 therefore does not reach the vicinity of the sensing member 32.

In the covered portion 50a, the adhesive member 80 moving upward in each clearance 43a, 43b, 43c stops to further move upward owing to the presence of the pressing surface 90a of the pressing member 90. The adhesive member 80 therefore cannot leak to the front surface of the sensor chip 30 and the front surface of the housing 40.

Upon finishing the pressing of the sensor chip by using the pressing member 90, the heater 95 activates in a state where the front surface 30b of the sensor chip 30 is pressed by the pressing surface 90a. The heat generated by the heater 95 conducts to the adhesive member 80 via the sensor chip 30, and causes the adhesive member 80, which has a thermosetting property, to harden. Since the sensor chip 30 is formed using the silicon substrate having a high thermal conductivity, the adhesive member 80 hardens in a moment.

Figure 10A:
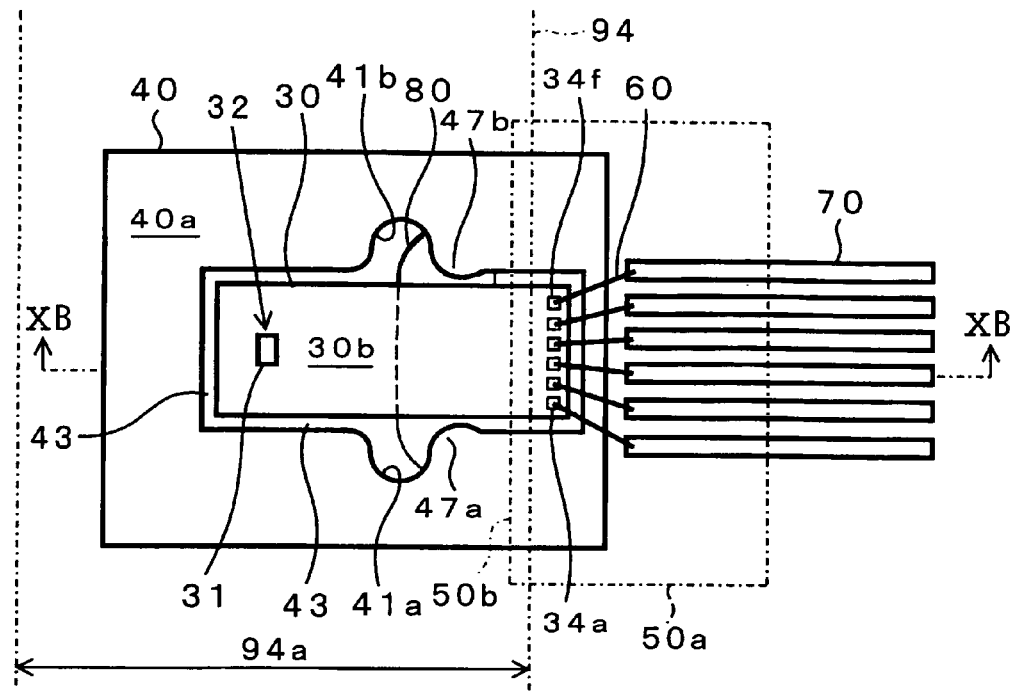
FIG. 10A is a plan view diagram corresponding to S5 in FIG. 6 and illustrating a state where a lead is connected to a sensor chip by wiring.
Figure 10B:
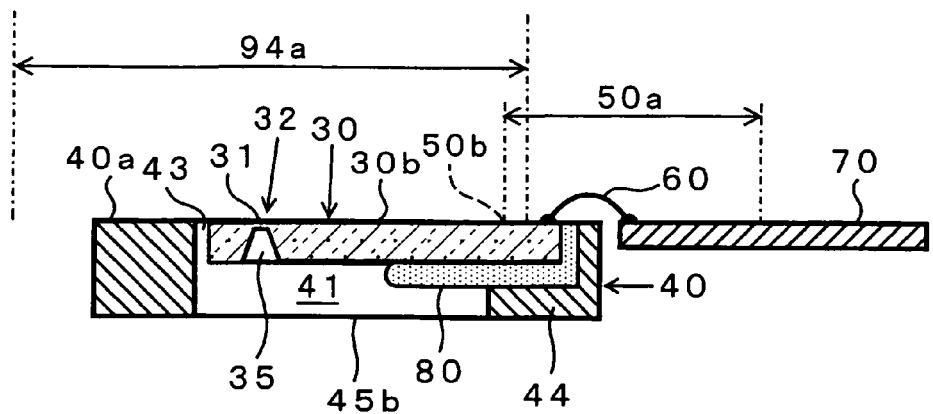
FIG. 10B is a cross sectional diagram taken along line XB-XB in FIG. 10A.

At S5, each pad 34a to 34f of the sensor chip 30 is electrically connected to a corresponding one of the leads 70. In the present embodiment, the electrical connection between the each pad 34a to 34f and the corresponding lead 70 is made using the wire 60 by wire bonding, as shown in FIGS. 10A and 10B. Alternatively, the pads 34a to 34f may be electrically connected with a printed circuit board instead of the lead 70, depending on an external element to which the heat type flow amount sensor apparatus is to be connected. In such a case, by ultrasonic welding, the pads 34a to 34f may be electrically connected to the printed circuit board with stud bumps.

Figure 11A:
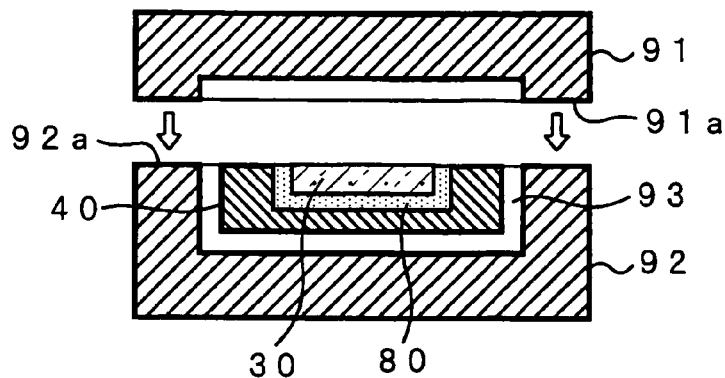
FIGS. 11A and 11B are cross sectional diagrams each corresponding to S7 in FIG. 6.
Figure 11B:
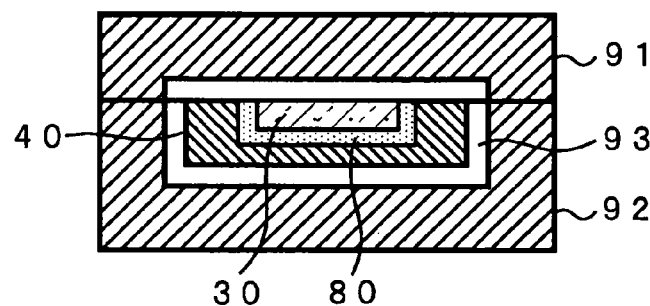

At S6, a portion 94a (referred to hereinafter as a film cover portion) including the boundary part 50b of the covered portion 50a is covered with a film 94 made of synthetic resin, as shown in FIGS. 10A and 10B. At S7, as shown in FIG. 11A, the members formed through S1 to S6 are placed in a mold space 93 (space for forming the molded member 50 by injection molding through injecting a molding material) defined by a lower part 92 of a mold. Then, as shown in FIG. 11B, an upper part 91 of the mold is connected to the lower part 92 of the mold to close the mold.

In the above, a lower surface 91a of the upper part 91 of the mold has a part that corresponds to the covered portion 50a and that defines the mold space 93. The other part of the lower surface 91a of the upper part 91 contacts a part of the front surface 40a of the housing 40 and a part of the front surface 30b of the sensor chip 30, wherein the part of the front surface 30b and the part of the front surface 40a extends from the boundary part 50b to the film covered portion 94a. Similarly, an upper surface 92a of the lower part 92 of the mold has a part that corresponds to the covered portion 50a and that defines the mold space 93. The other part of the upper surface 92a contacts a part of the back surface of the housing 40 and a part of the back surface of the sensor chip 30, wherein the parts of the back surfaces of the housing 40 corresponds to the other part of the lower surface 91a of the upper part 91 of the mold.

Figure 11C:
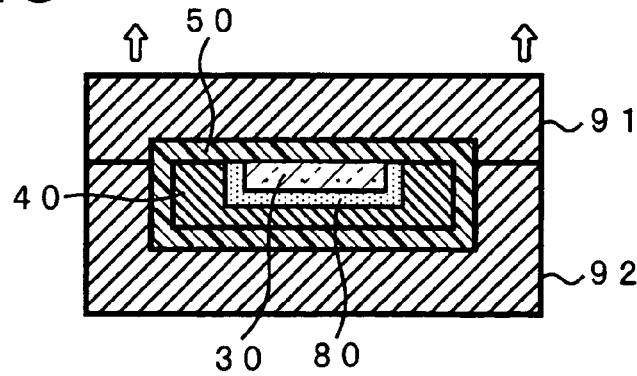
FIG. 11C is a cross sectional diagram corresponding to S8 in FIG. 6.

As S8, as shown in FIG. 11C, a molding material is injected into the mold space 93 to fill the mold space 93 with the molding material. In the above, the front surface of the sensor chip 30, the front surface of the housing 40, and a surface of the adhesive member 80 reaching an upper end of the clearance 43a, 43b are in the same plane at the boundary part 50b of the covered portion 50a, as shown in FIG. 9B. Thus, a gap is not formed between the lower surface 91a of the upper part 91 of the mold and the above-described surfaces being in the same plane. The injected molding material cannot spread and cannot leak to the front surface 40a of the housing 40 beyond the boundary part 50b.

There may exist a possibility that the side surfaces 36a, 36b have irregularities resulting from, for example, a process of forming the sensor chip 30 by dicing a semiconductor substrate. However, since the irregularities are filled with the adhesive member 80, the molding material cannot leak out via the irregularities. This commonly happens when the inner side walls 42a, 42b of the housing 40 have irregularities.

Figure 12A:
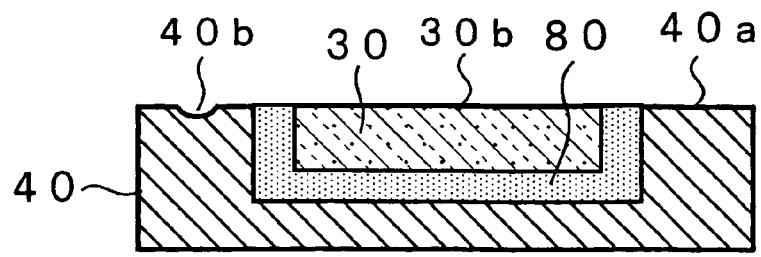
FIG. 12A is a cross sectional diagram illustrating a surface flaw formed on a housing.
Figure 12B:
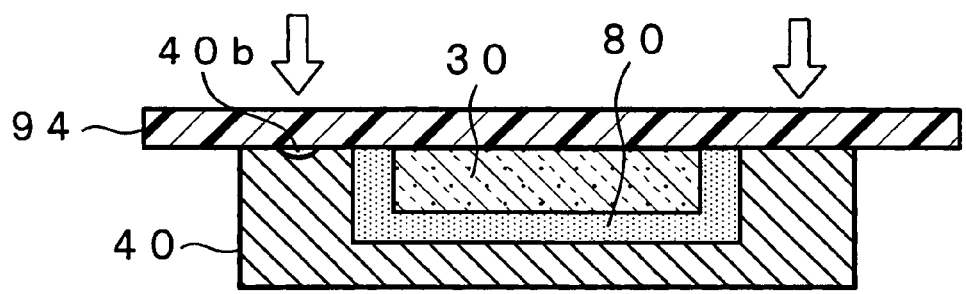
FIG. 12B is a cross sectional diagram illustrating a film placed on a housing.
Figure 12C:
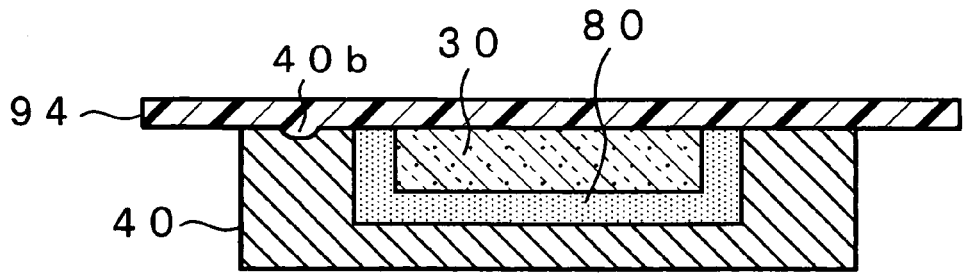
FIG. 12C is a cross sectional diagram illustrating a state where a surface flaw is filled with a film.

Here, it is assumed that, as shown in FIG. 12A, the front surface 40a of the housing 40 has a flaw in a concave shape at a part crossing the boundary part 50b. At S6, the film 94 covers the flaw 40b, as shown in FIG. 12B. Then, a pressure applied when the mold is closed presses and deforms the film located between the lower surface 91a of the upper part 91 of the mold and the front surface 40a of the housing, and then, the flaw 40b is filled with the film 94, as shown in FIG. 12C.

Accordingly, the molding material injected into the mold space 93 at S8 cannot spread and cannot reach the front surface 30b of the sensor chip 30 and the front surface 40a of the housing 40 beyond the boundary part 50b. Further, when the front surface 30b of the sensor chip 30 has a flaw at a portion extending across the boundary part 50b, the flow is filled with the film 94, and thus, the molding material cannot leak out via the flaw. Further, when a surface 80a or a surface 80b (see FIG. 9B) of the adhesive member 80 has a flaw at a portion extending across the boundary part 50b, the flaw is also filled with the film 94, and thus, the molding material cannot leak out via the flaw.

When the front surface 30b of the sensor chip 30 and the front surface 40a of the housing form a step therebetween at a portion extending across the boundary part 50b owing to a dimensional tolerance of the housing 40 or the sensor chip 30, the step is covered with the film 94, and thus, the molding material cannot leak out via the step. When the lower surface 91a of the upper part 91 of the mold has a flaw at a portion extending across the boundary part 50b, the flaw is filled with the film 94, and thus, the molding material cannot leak out via the flaw.

When another factor other then the flaw in a concave shape, such as a foreign element having a convex shape, exists at the boundary part 50b, the foreign element is absorbed or covered by the film 94 and does not form a gap, and thus, the foreign element cannot be a factor for leaking the molding material.

Figure 11D:
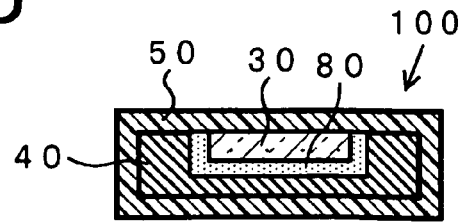
FIG. 11D is a cross sectional diagram illustrating a heat type flow amount sensor apparatus manufactured.

At S9, a surface of the mold corresponding to the mold space 93 is cooled, and the molding material filling in the mold space 93 hardens. Then, at S10, the upper part 91 of the mold is moved upward to open the mold. At S11, the heat type flow amount sensor apparatus 100 is removed from the mold space 93, as shown in FIG. 11D.

According to the heat type flow amount sensor apparatus 100 and the method of manufacturing the same, a gap is not formed at the boundary part 50b of the covered portion 50a when the covered portion 50a is formed using the molding material by injection molding, and thus, the molding material cannot leak to a region other than the covered portion. It is possible to prevent leak of the molding material without using a buffering member, which is used in a conventional manner. Thus, it is possible to improve a production yield and production efficiency of a heat type flow amount sensor apparatus.

(Modifications)

The above embodiment can be modified and extended in various ways. Examples of modifications will be described below.

(First Modification)

A position, a shape and a size of the relief portion, and the number of relief portions can be changed as long as the pushed out adhesive member cannot reach the vicinity of the sensing member 32.

Figure 13A:
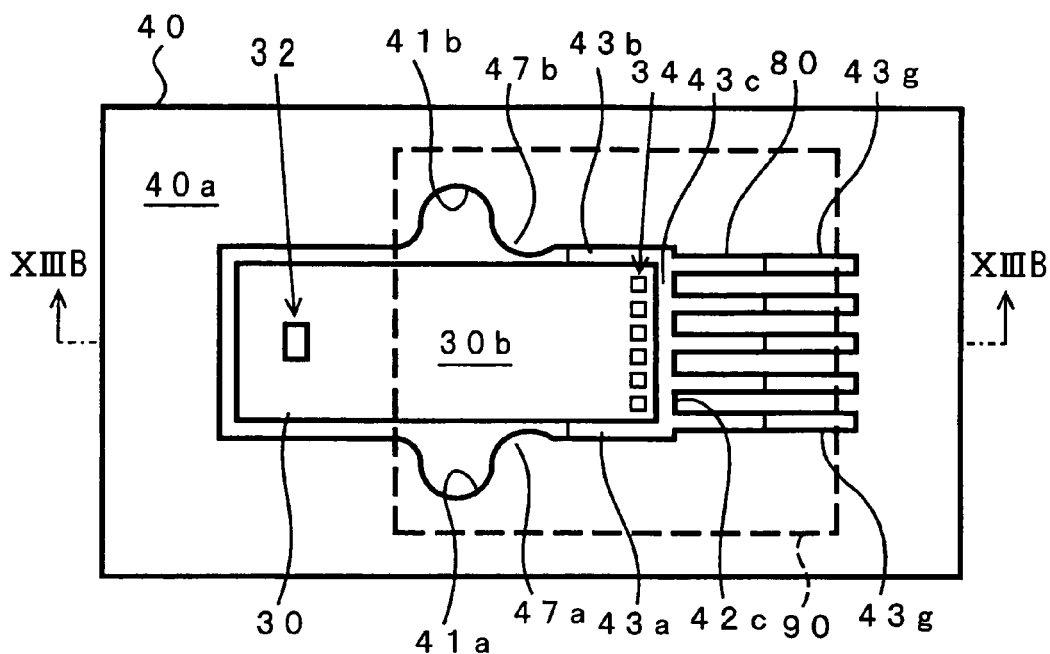
FIG. 13A is a plan view diagram illustrating a relief portion in accordance with a first modification of the exemplary embodiment.
Figure 13B:
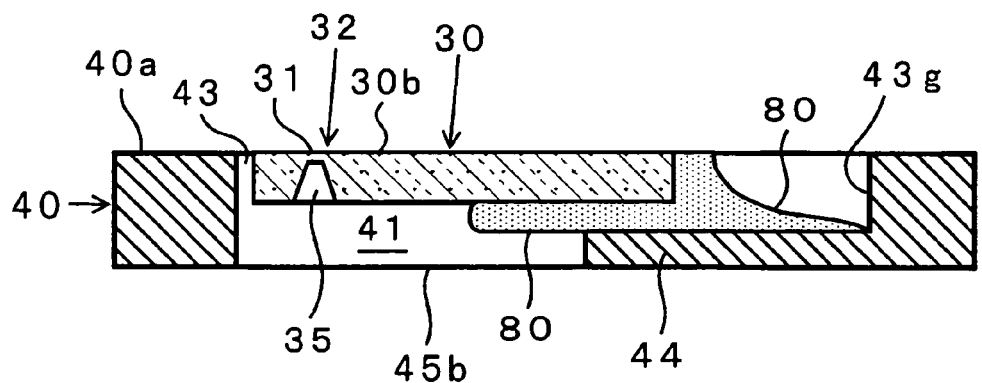
FIG. 13B is a cross sectional diagram taken along line XIIIB-XIIIB in FIG. 13A.

For example, as shown in FIGS. 13A and 13B, the inner side wall 42c of the housing 40 located on a pad 34 side may defines relief portions 43g arranged at predetermined intervals each. Each relief portion 43g has a ditch shape and is in communication with the clearance 43c and extends in a direction away from the sensing member 32. According to the above structure, it is possible to move an extra part of the adhesive member, which is pressed, deformed and pushed out by the sensor chip 30 and the housing 40, in a direction away from the sensing member 32.

(Second Modification)

Figure 14:
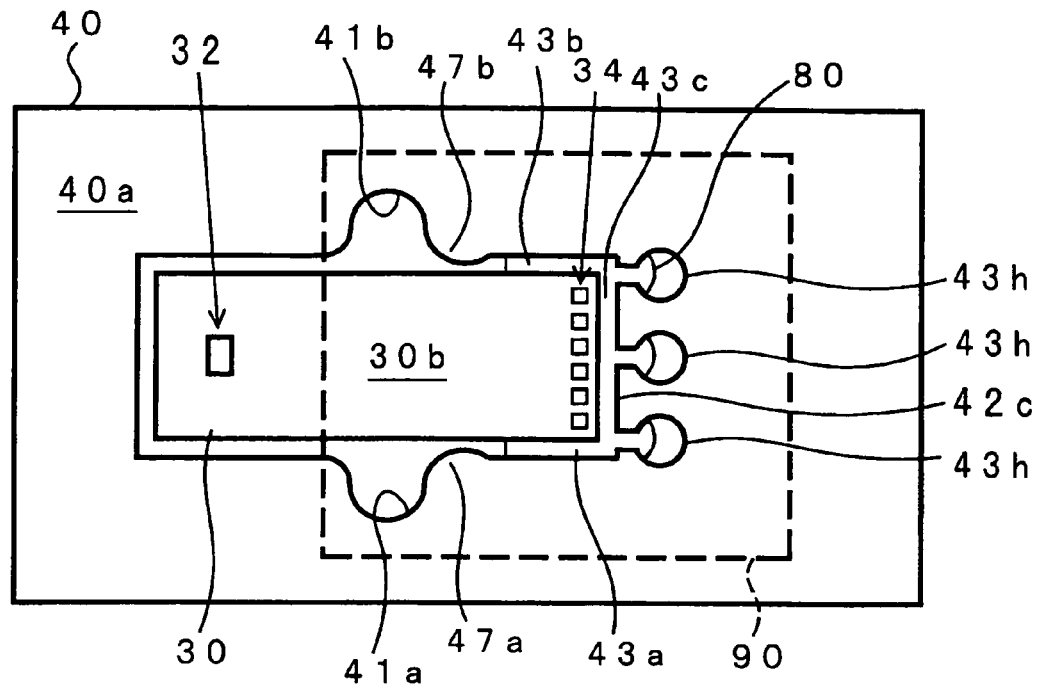
FIG. 14 is a plan view diagram illustrating a relief portion in accordance with a second modification of the exemplary embodiment.

As shown in FIG. 14, the inner side wall 42c of the housing 40 on a pad 34 side may defines relief portions 43h each formed in a circular arc shape in a plan view. According to the above structure, it is possible to provide an advantage generally identical to that of the first modification.

(Third Modification)

Figure 15:
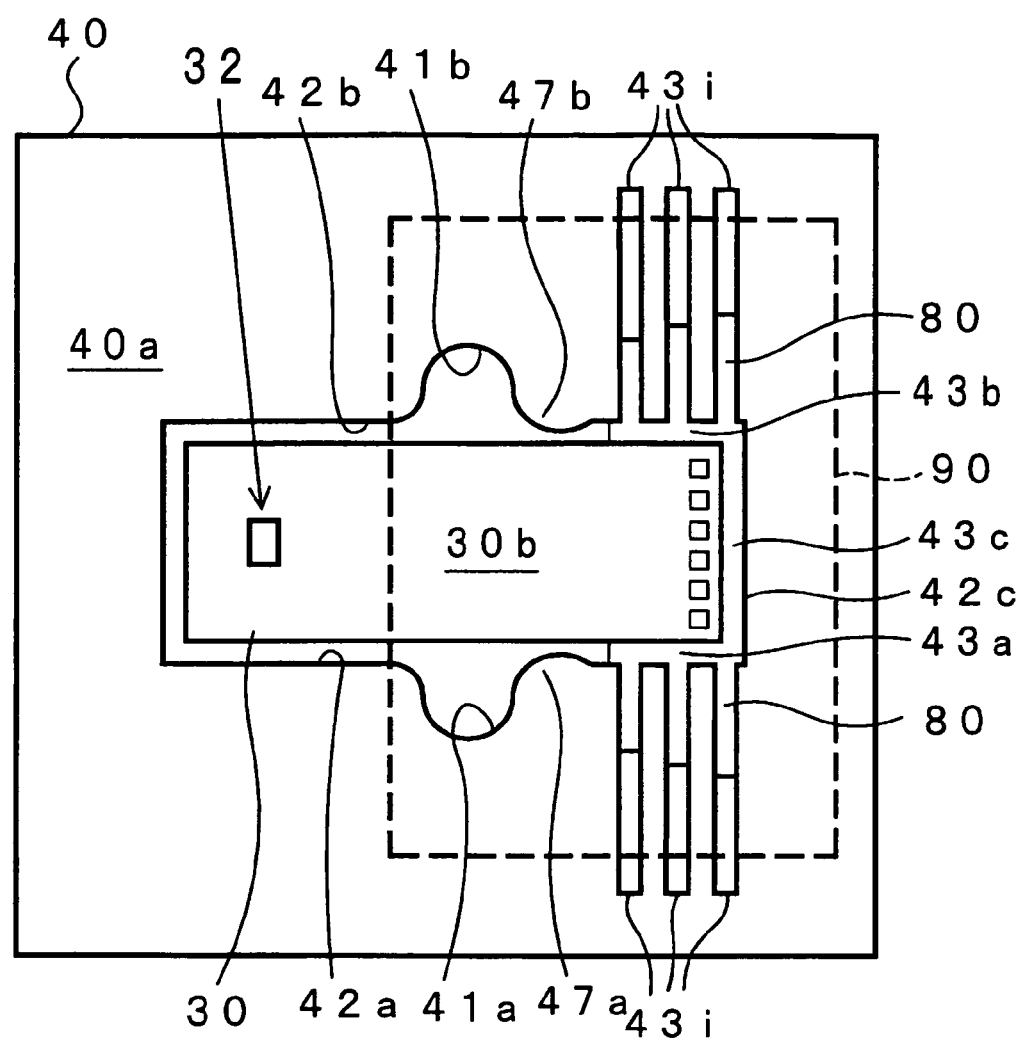
FIG. 15 is a plan view diagram illustrating a relief portion in accordance with a third modification of the exemplary embodiment.

As shown in FIG. 15, the inner side wall 42a of the housing 40 defining the clearance 43a may further defines multiple relief portions 43i each having a ditch shape and each extending outwardly. Further, the inner side wall 42b of the housing 40 defining the clearance 43b may further defines multiple relief portions 43i each having a ditch shape and each extending outwardly. According to the above structure, it is possible to provide an advantage generally identical to that of the first modification.

(Fourth Modification)

Figure 16:
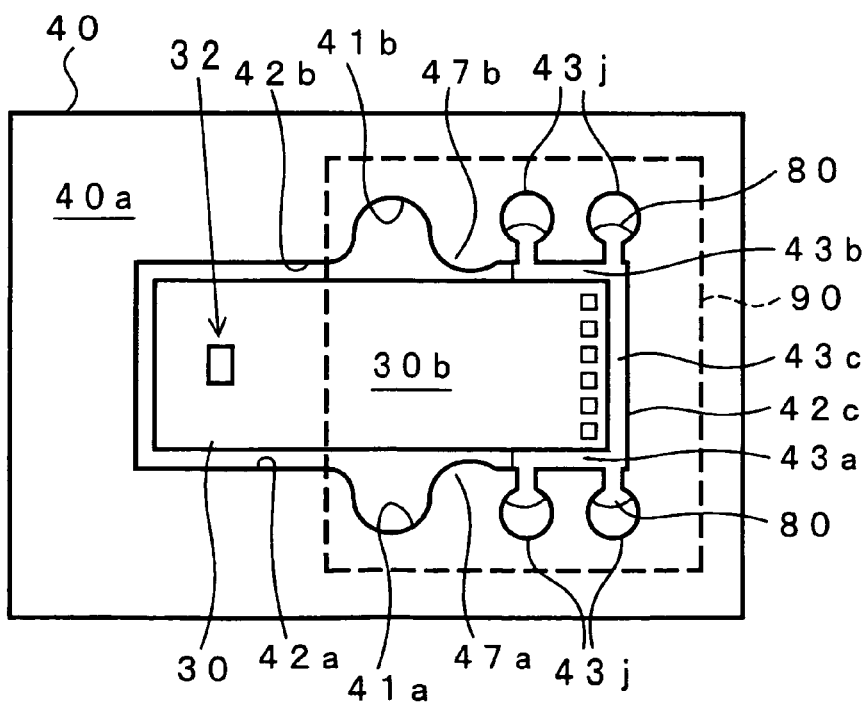
FIG. 16 is a plan view diagram illustrating a relief portion in accordance with a fourth modification of the exemplary embodiment.

As shown in FIG. 16, the inner side wall 42a of the housing 40 defining the clearance 43a may further defines multiple relief portions 43j each having a circular arc shape in a plan view and each extending outwardly. Further, the inner side wall 42b of the housing 40 defining the clearance 43b may further defines multiple relief portions 43i each having a circular arc shape in a plan view each extending outwardly. According to the above structure, it is possible to provide an advantage generally identical to that of the first modification.

In the first, third and fourth modifications, since the inner side wall 42c on a pad 34 side does not define a relive portion, it is possible to reduce a gap between the pads 34 and the leads 70.

(Fifth Modification)

Figure 17A:
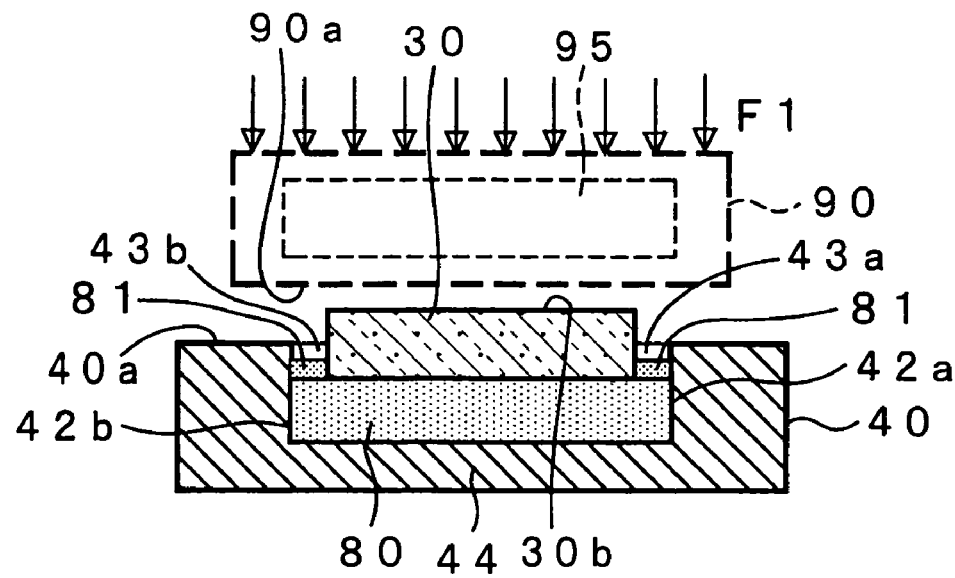
FIG. 17A a cross sectional diagram illustrating an adhesive member prior to pressing in accordance with a fifth modification of the exemplary embodiment.
Figure 17B:
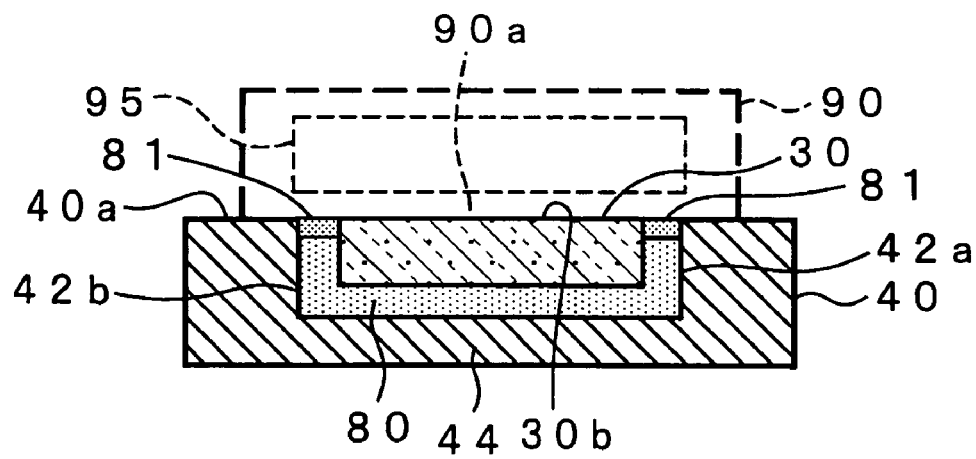
FIG. 17B a cross sectional diagram illustrating the adhesive member after the pressing in accordance with the fifth modification of the exemplary embodiment.

FIG. 17A is a cross sectional diagram illustrating the adhesive member prior to pressing in accordance with a fifth modification. FIG. 17B is a cross sectional diagram illustrating the adhesive member after the pressing in accordance with the fifth modification. As shown in FIG. 17A, although the adhesive member is located between the sensor chip 30 and the bonding member 44, both end parts of the adhesive member 80 respectively reach the inner side walls 42a, 42b of the housing 40. Further, other adhesive members 81 thinner than the adhesive member 80 are respectively located on surfaces of both end parts of the adhesive member 80.

The adhesive members 81 are respectively formed in sizes so that, when the sensor chip 30 is placed on the adhesive member 80, the adhesive members 81 can placed in clearances 43a, 43b between the side surfaces of the sensor chip 30 and the inner side walls 42a, 42b of the housing 40. By placing the adhesive members 81 on both end parts of the surface of the adhesive member 80, a thickness given by the adhesive members 80, 81 becomes larger than a thickness of the adhesive member 80 located on the back surface of the sensor chip 30.

As shown in FIG. 17B, the front surface 30b of the sensor chip 30 is pressed by the pressing surface 90a of the pressing member 90, and then, the adhesive member 80 is pressed and deformed, and the pressed adhesive member 80 partially flows in the clearances 43a, 43b. Thereby, each adhesive member 81 moves upward until contacting the pressing surface 90a, and the clearances 43a, 43b are filled.

According to the above manners, it is possible to supply shortage of, if it occurs, the adhesive member that flows in the clearances 43a, 43b and possible to reliably close each clearance 43a, 43b, by further placing the adhesive members 81 on the adhesive member 80 exposed in the clearances 43a, 43b, which are between the side surfaces of the sensor chip 30 and the inner side walls of the housing 40.

Alternatively, the adhesive members 80, 81 may be integrated in advance and may be placed on the bonding member. In such a case, it is possible to reduce a process of placing the adhesive member one time. Alternatively, an adhesive member having a concave shape in a longitudinal cross sectional view may be employed, and the sensor chip 30 may be placed on a bottom of the concave shape of the adhesive member.

(Other Modifications)

(I) The adhesive member may be placed on a part of the back surface of the sensor chip 30 that corresponds to the surface 44a of the bonding member 44, and the sensor chip 30 may be placed on the surface 44a of the bonding member 44.

(II) The housing 40 that defines the receive space having a closed bottom may be used, and the part of the sensor chip 30 on the second end side may be bonded to a part of the bottom of the receive space on the second end side.

(III) The throttle portions may be formed on each of three or four inner side walls of the housing 40. In such a case, it becomes possible to more easily position the sensor chip 30, and possible to improve the positioning accuracy.

(IV) The above embodiments can be applied to not only a heat flow amount sensor apparatus but various sensor apparatuses in which a sensing member is exposed. The various sensor apparatuses include a pressure sensor apparatus, a humidity sensor apparatus, a solar radiation sensor apparatus, an infrared sensor apparatus and the like.

The above embodiments and the modifications have the following aspects.

According to a first aspect, a method of manufacturing a sensor apparatus is provided. The method includes: preparing a sensor chip 30 including a substrate 30a, a sensing member 32 located on the substrate 30a, and a terminal 34a to 34f located on the substrate 30a and configured to output a signal from the sensing member 32; and preparing a housing 40. The housing 40 has (i) a first opening 45a on a front surface thereof, (ii) an inner side wall 42a to 42d defining a receive space 41 therein communicating with the first opening 45a, and (iii) a bonding member 44 located on an inner bottom surface of the housing 40 at a boundary part 50b of a predetermined portion 50a. The inner bottom surface defines a bottom of the receive space 41. A depth D2 defined between the first opening 45a and the bonding member 44 is deeper compared to a thickness D1 of the sensor chip 30. The method further includes: placing an adhesive member 80 on one of the bonding member 44 and a back surface of the sensor chip 30; and placing the sensor chip 30 in the receive space 41 through the first opening 45a so that the sensing member 32 is exposed. The placing of the sensor chip 30 includes placing the back surface of the sensor chip 30 on the bonding member 44 via the adhesive member 80 to form a clearance 43 between a side surface 36a to 36d of the sensor chip 30 and the inner side wall 42a to 42d of the housing 40. The method further includes: pressing the front surface of the sensor chip 30 whose back surface is placed on the bonding member 44, so that: the sensor chip 30 and the housing 40 push the adhesive member 80 to the clearance 43; and the front surface of the sensor chip 30, the front surface of the housing 40 and a surface of a part of the adhesive member 80 pushed in the clearance 43 are in a same plane at the boundary part 50b. The method further includes: electrically connecting the terminal 34a to 34f to an electrical conductive member 60, the electrical conductive member 60 to be electrically connected to an external element 70; and forming, by injection molding, a molded member 50 that covers the predetermined portion 50a including a connection part where the terminal 34a to 34f and the electric conductive member 60 are connected with each other. The forming of the molded member 50 includes: closing a mold receiving the sensor chip 30, the housing 40 and the electric conductive member 60, after the pressing of the front surface of the sensor chip 30 and the electrically connecting of the terminal 34a to 34f; and injecting a molding material in the mold.

According to a second aspect, a sensor apparatus is provided that includes: a sensor chip 30 including a substrate 30a, a sensing member 32 located on the substrate 30a, and a terminal 34a to 34f located on the substrate 30a and configured to output a signal from the sensing member 32; a housing 40 receiving the sensor chip 30 with the sensing member 32 of the sensor chip 30 being exposed; an electric conductive member 60 electrically connected with the terminal 34a to 34f and to be electrically connected with an external element 70; and a molded member 50 covering a covered portion 50a including a connection portion where the terminal 34a to 34f and the electric conductive member 60 are connected with each other. The housing 40 has a first opening 45a on a front surface thereof. The housing 40 defines a receive space 41 therein (i) communicating with the first opening 45a and (ii) receiving the sensor chip 30 through the first opening 45a while the housing 40 and a side surface 36a to 36d of the sensor chip 30 define a clearance 43 therebetween. The housing 40 further has a bonding member 44. The bonding member 44 is located on an inner bottom surface of the housing 40 at a place corresponding to a boundary part 50b of the covered portion 50a, the inner bottom surface defining a bottom of the receive space 41. The bonding member 44 is bonded to a back surface of the sensor chip 30 via an adhesive member 80. The first opening 45a and the bonding member 44 define therebetween a depth D2, the depth D2 being deeper compared to a thickness D1 of the sensor chip 30. A part of the adhesive member 80 is located in the clearance 43 by being pressed and pushed out by the sensor chip 30 and the housing 40. The front surface of the housing 40, a surface of the part of the adhesive member 80, and a front surface of the sensor chip 30 are in a same plane at the boundary part 50b.

According to the above sensor apparatus and the manufacturing method, when the front surface of the sensor chip placed on the bonding member of the housing is pressed, the adhesive member placed between the back surface of the sensor chip and the bonding member is partially pushed out and flows in the clearance between the side surface of the sensor chip and the inner side wall of the housing. Then, the surface of the part of the adhesive member flowing in the clearance, the front surface of the sensor chip, and the front surface of the housing are in the same plane at the boundary part of the covered portion (i.e., predetermined portion).

Accordingly, in injecting the molding material into the predetermined portion, a gap is not formed between the mold and the above surfaces, and thus, the molding material cannot leak a region other than the covered portion (i.e., a predetermined portion). Thus, it is possible to prevent the leak of the molding material without using a buffer member, which is used in a conventional manner. It is possible to improve a production yield of the sensor apparatus. Further, it is possible to improve production efficiency of the sensor apparatus.

According to a third aspect, a method of manufacturing a sensor apparatus is provided. The method includes: preparing a sensor chip 30 including a substrate 30a, a sensing member 32 located on the substrate 30a, and a terminal 34a to 34f located on the substrate 30a and configured to output a signal from the sensing member 32; and preparing a housing 40. The housing 40 has (i) a first opening 45a on a front surface of the housing 40, (ii) an inner side wall 42a to 42d defining a receive space 41 therein communicating with the first opening 45a, and (iii) a bonding member 44 located on an inner bottom surface of the housing 40 at a boundary part 50b of a predetermined portion 50a. The inner bottom surface defines a bottom of the receive space 41. A depth D2 defined between the first opening 45a and the bonding member 44 is deeper compared to a thickness D1 of the sensor chip 30. The method further includes: placing an adhesive member 80 on one of the bonding member 44 and a back surface of the sensor chip 30; placing the sensor chip 30 in the receive space 41 through the first opening 45a so that the sensing member 32 is exposed. The placing of the sensor chip 30 includes placing the back surface of the sensor chip 30 on the bonding member 44 via the adhesive member 80 to form a clearance 43 between a side surface 36a to 36d of the sensor chip 30 and the inner side wall 42a to 42d of the housing 40. The method further includes: pressing the front surface of the sensor chip 30 whose back surface is placed on the bonding member 44, so that the sensor chip 30 and the housing 40 push the adhesive member 80 to the clearance 43; electrically connecting the terminal 34a to 34f to an electrical conductive member 60, the electrical conductive member 60 to be electrically connected to an external element 70; placing a film 94 on the front surface of the sensor chip 30 and the front surface of the housing 40 so that the film 94 covers the boundary part 50b of the predetermined portion 50a, after the pressing of the front surface of the sensor chip 30 and the electrically connecting of the terminal 34a to 34f; and forming, by injection molding, a molded member 50 that covers the predetermined portion 50a including a connection part where the terminal 34a to 34f and the electric conductive member 60 are connected with each other. The forming of the molded member 50 includes: closing a mold receiving the sensor chip 30, the housing 40 and the electric conductive member 60, after the pressing of the front surface of the sensor chip 30 and the electrically connecting of the terminal 34a to 34f; and injecting a molding material in the mold.

When the sensor chip or the housing has tiny irregularities on surfaces at a boundary part of a predetermined portion, one may suppose that a gap is formed between the mold and the surfaces and the molding material would leak via the irregularities in forming the molded member through injecting the molding material into the predetermined portion. According to the above manufacturing method, however, the mold is closed in a state where the film is formed on the front surface of the sensor chip and the front surface of the housing so as to cover the boundary part. The irregularities are filled with the film owing to pressure of the closing of the mold, and as a result, the gap disappears.

Accordingly, in injecting the molding material into the predetermined portion, a gap between the mold and the above surfaces does not exist there is not. Thus, the molding material cannot leak a region other than the covered portion (i.e., a predetermined portion). It is possible to prevent the leak of the molding material without using a buffer member, which is used in a conventional manner. It is possible to improve a production yield of the sensor apparatus. Further, it is possible to improve production efficiency of the sensor apparatus.

Further, even if, at the boundary part of the predetermined portion, there is formed irregularities resulting from a step between the above surfaces (i.e., the surface the part of the adhesive member flowing in the clearance, the front surface of the sensor chip, and the front surface of the housing, the irregularities can be filled with the film. Therefore, the molding material cannot the leak via the step.

The manufacturing method according to the third aspect may further have the following feature. The film 94 is placed so as to cover: the boundary part 50b; the sensing member 32; a part of the sensor chip 30 between the boundary part 50b and the sensing member 32; and the front surface of the housing 40.

Accordingly, the film can function as a buffer member to protect a surface of the sensor chip and a surface of the housing from damage due to contact with the mold in the closing the mold.

The manufacturing method according to the first or third aspect may further have the following feature. The inner side wall 42a, 42b of the housing 40 defines an in-flow portion 41a, 41b having a capacity for receiving the part of the adhesive member 80 pushed to the clearance 43.

The sensor apparatus according to the second aspect may further has the following feature. The housing 40 has an inner side wall 42a to 42d defining the clearance 43, and the inner side wall 42a, 42b of the housing 40 further defines an in-flow portion 41a, 41b having a capacity for receiving the part of the adhesive member 80 pushed out to the clearance 43.

According to the above manners, the in-flow portion is formed on the inner side wall, which defines the clearance, of the housing. The adhesive member pushed to the clearance can flow into the in-flow portion. Thereby, since it is possible to flow an extra part of the adhesive member into the in-flow portion, it is possible limit flow of the adhesive member in the clearance. The extra part of the adhesive member cannot leak from the clearance to the surface of the sensor chip or the surface of the housing.

The above adhesive member 80 may have a volume such that the part of the adhesive member 80 pushed to the clearance 43 flows in the in-flow portion 41a, 41b when the front surface of the sensor chip 30 is pressed.

When there is a variation in volume of the clearance at the boundary part, there is a variation in volume of the adhesive member required to fill the clearance at the boundary part. If the variation exists, when an amount of the adhesive member is determined in accordance with a minimum volume of the clearance, the surface of the adhesive member filling the clearance may be positioned lower than the surface of the sensor chip and the surface of the housing, owing to shortage of the adhesive member.

According to the above manner, however, even if there is a variation in the volume of the clearance, it is possible to reliably fill the clearance with the adhesive member, since: a volume of the adhesive member is set such that: the part of the adhesive member 80 pushed to the clearance 43 flows in the in-flow portion 41a, 41b when the front surface of the sensor chip 30 is pressed. In other words, the volume of the adhesive member is set such that the, even if the adhesive member fills the clearance at the boundary part, the adhesive member still has an extra part that is to flow into the in-flow part. Therefore, it is not necessary to control a size of the sensor chip and a size of the housing with high accuracy. It is possible to further improve a production yield of the sensor apparatus. Further, it is possible to further improve production efficiency of the sensor apparatus.

The manufacturing method according to the first aspect or the third aspect may further have the following features. The side surface 36a to 36d of the sensor chip 30 includes a first side surface 36a, a second side surface 36b and a third side surface 36c. The first and second side surfaces 36a, 36b are opposite to each other, and are continuously connected to a first end and a second end of the third side surface 36c, respectively. The third side surface 36c is located on a terminal 34a to 34f side. The inner side wall 42a to 42d of the housing 40 includes a first inner side wall 42a facing the first side surface 36a of the sensor chip 30 and a second inner side wall 42b facing the second side surface 36b of the sensor chip 30. The first side surface 36a of the sensor chip 30 and the first inner side wall 42a of the housing 40 define therebetween a first clearance 43 included in the clearance 43. The second side surface 36b of the sensor chip 30 and the second inner side wall 42b of the housing 40 define therebetween a second clearance 43 included in the clearance 43. The first inner side wall 42a and the second inner side wall 42b of the housing 40 respectively define a first in-flow portion 41a and a second in-flow portion 41b included in the in-flow portion.

The sensor apparatus according to the second aspect may further have the following features. The side surface 36a to 36d of the sensor chip 30 includes a first side surface 36a, a second side surface 36b and a third side surface 36c. The first and second side surfaces 36a, 36b are opposite to each other, and are continuously connected to a first end and a second end of the third side surface 36c, respectively. The third side surface 36c is located on a terminal 34a to 34f side. The inner side wall 42a to 42d of the housing 40 includes a first inner side wall 42a facing the first side surface 36a of the sensor chip 30 and a second inner side wall 42b facing the second side surface 36b of the sensor chip 30. The first side surface 36a of the sensor chip 30 and the first inner side wall 42a of the housing 40 define therebetween a first clearance 43 included in the clearance 43. The second side surface 36b of the sensor chip 30 and the second inner side wall 42b of the housing 40 define therebetween a second clearance 43 included in the clearance 43. The first inner side wall 42a and the second inner side wall 42b of the housing 40 respectively define a first in-flow portion 41a and a second in-flow portion 41b included in the in-flow portion.

According the above features, since the clearance includes the first and second clearances, the adhesive member pushed by the sensor chip and the bonding member flows along the first and second side surfaces of the sensor chip. Accordingly, since the first and second in-flow portions are respectively formed on the first and second inner side walls of the housing, the adhesive member flowing along the first and second side surfaces of the sensor chip can flow into the first and second in-flow portions, respectively. As a result, it is possible to restrict a variation in volume of the adhesive member between that flowing along the first side surface of the sensor chip and that flowing along the second side surface, and it is possible to prevent the adhesive member from leaking to a portion of the front surface of the housing on one of a first clearance side or a second clearance side.

The above manufacturing method according to the third aspect may further have the following features. The inner side wall 42a to 42d of the housing 40 includes a third inner side wall 42c facing the third side surface 36c of the sensor chip 30. The third side surface 36c of the sensor chip 30 and the third inner side wall 42c of the housing 40 define therebetween a third clearance 43 included in the clearance 43. The third inner side wall 42c defines a third in-flow portion 41a, 41b included in the in-flow portion.

The above sensor apparatus according to the second aspect may further have the following features. The inner side wall 42a to 42d of the housing 40 includes a third inner side wall 42c facing the third side surface 36c of the sensor chip 30. The third side surface 36c of the sensor chip 30 and the third inner side wall 42c of the housing 40 define therebetween a third clearance 43 included in the clearance 43. The third inner side wall 42c defines a third in-flow portion 41a, 41b included in the in-flow portion.

According to the above manufacturing method or sensor apparatus, the adhesive member flowing in the third clearance can further flow into the third clearance. As a result, it is possible to prevent the adhesive member flowing in the third clearance from leaking to a portion of the front surface of the housing on one of a first clearance side or a second clearance side.

The above manufacturing method according to the third aspect or the above sensor apparatus according to the second aspect may alternatively have the following features. The inner side wall 42a to 42d of the housing 40 includes a third inner side wall 42c facing the third side surface 36c of the sensor chip 30; the third side surface 36c of the sensor chip 30 and the third inner side wall 42c of the housing 40 define therebetween a third clearance 43 included in the clearance 43. The third inner side wall 42c does not define the in-flow portion 41a, 41b.

According to the above method or the above sensor apparatus, since the in-flow portion is not formed on the third inner side wall of the housing, the in-flow portion cannot be an obstacle for electrical connection of the terminal to the electric conductive member.

The manufacturing method according to the first or third aspect and the sensor apparatus according to the second aspect may further have the following features. The sensing member 32 of the sensor chip 30 outputs a signal that depends on a flow amount of air. The pressing of the front surface of the sensor chip 30 includes causing the front surface of the sensor chip 30 and the front surface of the housing 40 to be in the same plane.

When the sensing member is used for outputting a signal that depends on a flow amount of air, it is desirable that the air flowing around the sensing member be not disordered. According the above method and sensor apparatus, since the pressing the sensor chip causes the front surface of the sensor chip and the front surface of the housing to be in the same plane, the front surface of the sensor chip and the front surface of the housing does not form a gap, which can be a factor for disordering the air flowing around the sensing member.

The method according to the first or third aspect may further have the following features. The inner side wall 42a to 42d of the housing 40 defines a positioning portion 47a, 47b for positioning the sensor chip 30 in the receive space 41 of the housing 40. In the placing of the sensor chip 30 in the receive space 41, the sensor chip 30 is positioned with reference to the positioning portion 47a, 47b.

The sensor apparatus according to the second aspect may have the following features. The inner side wall 42a to 42d of the housing 40 defines a positioning portion 47a, 47b for use in positioning the sensor chip 30 in the receive space 41 of the housing 40.

According the above manufacturing method and the above sensor apparatus, it is possible to easily position the sensor chip on the bonding member of the housing with reference to the positioning portion formed on the inner side wall of the housing. Positioning of the sensor chip becomes easy.

The above manufacturing method and the above sensor apparatus may further have the following features. The inner side wall 42a to 42d of the housing 40 defines, at a region between the boundary part 50b and the in-flow portion, a throttle portion 47a, 47b that restricts a flow of the part of the adhesive member 80 in the clearance 43.

According to the above manufacturing method and the above sensor apparatus, since it is possible to restrict the flowing of the adhesive member in the clearance toward the in-flow portion, the adhesive member can readily flow in the clearance toward the surface. Therefore, at the boundary part, the adhesive member can be filled with the clearance and can reach the upper end of the clearance reliably, and thus, it is possible to eliminate a gap at the boundary part.

The above manufacturing method may further have the following features. The throttle portion 47a, 47b provides the positioning portion 47a, 47b. In the placing of the sensor chip 30 in the receive space 41, the sensor chip 30 is positioned with reference to the positioning part.

The above sensor apparatus may further have the following feature: the throttle portion 47a, 47b provides the positioning portion 47a, 47b.

According the above manufacturing method and the sensor apparatus, since the throttle portion 47a, 47b can function as the positioning portion 47a, 47b, it is necessary to form the throttle portion 47a, 47b and the positioning portion 47a, 47b separately. It is possible to further improve production efficiency of the sensor apparatus.

The manufacturing method according to the first and third aspects, and the sensor apparatus according to the second aspect may further have the following features. The back surface of the sensor chip 30 has a first part at an end of the sensor chip 30, the first part corresponding to the boundary part 50b. The first part of the back surface is bonded to the bonding member 44 of the housing 40. Another part of the back surface of the sensor chip 30 other than the first part is spaced apart from the bottom of the receive space 41.

According the above manufacturing method and the sensor apparatus, the first part of the back surface of the sensor chip is bonded to the bonding member, and a part of the sensor chip other than the first part is spaced apart of the bottom of the receive space. It is thus possible reduce a bonded area of the sensor chip. Therefore, even if the sensor chip and the housing are made of materials having different coefficients of thermal expansion, it becomes possible to reduce thermal stress acting on the sensor chip, and thus, it is possible to prevent generation of warpage, strain or crack in the sensor chip.

In particular, when the sensing member is one that detects a flow amount of air, it is possible to restrict reduction of detection accuracy of the flow amount of air. Further, when the sensor chip is configured such that an electric path for electrically connecting the sensing member and an external control circuit is formed on the sensor chip, a piezoresistive effect resulting from the warpage or strain in the sensor chip may cause a change of an electric signal traveling on the electric path and may reduce the detection accuracy.

According to the above manufacturing method and the sensor apparatus, however, it is possible to reduce the warpage and the strain in the sensor chip, and therefore, the reduction of detection accuracy resulting from a piezoresistive effect can be prevented.

The manufacturing method according to the first and third aspects, and the sensor apparatus according to the second aspect may further have the following feature: the inner bottom surface of the housing 40 has a second opening at a region other than the bonding member 44.

According to the above manufacturing method and the sensor apparatus, since a part of the bottom of the receive space other than the bonding member is opened, a front surface and a back surface of the sensing member is exposed to a common environment.

The manufacturing method according to the first aspect and the third aspect may further have the following features. The adhesive member 80 includes a thermosetting adhesive member 80. The pressing of the front surface of the sensor chip 30 includes: heating the adhesive member to harden the adhesive member.

The sensor apparatus according to the second aspect may further has the following features. The adhesive member 80 includes a thermosetting adhesive member 80.

According to the above manufacturing method and sensor apparatus, by pressing the front surface of the sensor chip that is placed on the bonding member via the adhesive member, it is possible to push out the adhesive member by the sensor chip and the housing, possible to flow into the clearance, and possible to harden the adhesive member by heating.

The manufacturing method according to the first aspect and the third aspect and the sensor apparatus according to the second aspect may further have the following feature: the adhesive member 80 has a film shape.

According to the above manufacturing method and the sensor apparatus, since the adhesive member has a film shape, the adhesive member is easy to deal and easy to be placed on the back surface of the sensor chip or the bonding member.

The manufacturing method according to the first aspect and the third aspect may further have the following feature: the substrate 30a includes a silicon substrate 30a.

According to the above manufacturing method and sensor apparatus, since the substrate includes the silicon substrate, it is possible to form and process an insulating layer and a conductive layer with ease. Further, since the silicon substrate has a high thermal conductivity, it is possible to harden the thermosetting adhesive member at a moment by heating the surface of the silicon substrate.

The manufacturing method according to the first aspect and the third aspect may further have the following aspect: in the pressing of the front surface of the sensor chip 30, a pressing surface 90a of a pressing member 90 presses the front surface of the sensor chip 30, the pressing surface 90a having an resistance to attachment of the adhesive member 80 thereto.

According to the above manufacturing method, since the font surface of the sensor chip is pressured by the pressing member having the pressing surface with the resistance to attachment of the adhesive member, it is possible to prevent the adhesive member from attaching to the pressing surface. Further, it is possible to prevent the housing from attaching the pressing member via the adhesive member.

In the above manufacturing method, the pressing surface 90a may be a planer surface.

In such a case, it is possible to, by pressing the front surface of the sensor chip, the following area be in the same plane: a surface of the adhesive member that projects from the clearance at the boundary part of the predetermined portion; the front surface of the sensor chip; and the front surface of the housing.

When the pressing of the front surface of the sensor chip stops at a time the pressing surface of the pressing member contacts the front surface of the housing, it is possible to make the front surface of the sensor chip and the front surface of the housing be in the same plane.

In particular, when the sensing member is one that detects a flow amount of air, since a step is not formed between the front surface of the sensor chip and the front surface of the housing, it is possible to efficiently prevent the air flowing around the sensing member from being disordered. It is therefore possible to improve detection accuracy.

While the invention has been described above with reference to various embodiments thereof, it is to be understood that the invention is not limited to the above described embodiments and construction. The invention is intended to cover various modifications and equivalent arrangements. In addition, while the various combinations and configurations described above are contemplated as embodying the invention, other combinations and configurations, including more, less or only a single element, are also contemplated as being within the scope of embodiments.

What is claimed is:

1. A method of manufacturing a sensor apparatus, comprising:
   preparing a sensor chip including a substrate, a sensing member located on the substrate, and a terminal located on the substrate and configured to output a signal from the sensing member;
   preparing a housing, wherein the housing has (i) a first opening on a front surface thereof, (ii) an inner side wall defining a receive space therein communicating with the first opening, and (iii) a bonding member located on an inner bottom surface of the housing at a boundary part of a predetermined portion, wherein the inner bottom surface defines a bottom of the receive space, wherein a depth defined between the first opening and the bonding member is deeper compared to a thickness of the sensor chip;
   placing an adhesive member on one of the bonding member and a back surface of the sensor chip;
   placing the sensor chip in the receive space through the first opening so that the sensing member is exposed, wherein the placing of the sensor chip includes
      placing the back surface of the sensor chip on the bonding member via the adhesive member to form a clearance between a side surface of the sensor chip and the inner side wall of the housing;
   pressing the front surface of the sensor chip whose back surface is placed on the bonding member, so that: the sensor chip and the housing push the adhesive member to the clearance; and the front surface of the sensor chip, the front surface of the housing and a surface of a part of the adhesive member pushed in the clearance are in a same plane at the boundary part;
   electrically connecting the terminal to an electrical conductive member, the electrical conductive member to be electrically connected to an external element; and
   forming, by injection molding, a molded member that covers the predetermined portion including a connection part where the terminal and the electric conductive member are connected with each other, wherein the forming of the molded member includes:
      closing a mold receiving the sensor chip, the housing and the electric conductive member, after the pressing of the front surface of the sensor chip and the electrically connecting of the terminal; and
      injecting a molding material in the mold.

2. A method of manufacturing a sensor apparatus, comprising:
   preparing a sensor chip including a substrate, a sensing member located on the substrate, and a terminal located on the substrate and configured to output a signal from the sensing member;
   preparing a housing, wherein the housing has (i) a first opening on a front surface of the housing, (ii) an inner side wall defining a receive space therein communicating with the first opening, and (iii) a bonding member located on an inner bottom surface of the housing at a boundary part of a predetermined portion, wherein the inner bottom surface defines a bottom of the receive space, wherein a depth defined between the first opening and the bonding member is deeper compared to a thickness of the sensor chip;
   placing an adhesive member on one of the bonding member and a back surface of the sensor chip;
   placing the sensor chip in the receive space through the first opening so that the sensing member is exposed, wherein the placing of the sensor chip includes
      placing the back surface of the sensor chip on the bonding member via the adhesive member to form a clearance between a side surface of the sensor chip and the inner side wall of the housing;
   pressing the front surface of the sensor chip whose back surface is placed on the bonding member, so that the sensor chip and the housing push the adhesive member to the clearance;
   electrically connecting the terminal to an electrical conductive member, the electrical conductive member to be electrically connected to an external element;
   placing a film on the front surface of the sensor chip and the front surface of the housing so that the film covers the boundary part of the predetermined portion, after the pressing of the front surface of the sensor chip and the electrically connecting of the terminal; and
   forming, by injection molding, a molded member that covers the predetermined portion including a connection part where the terminal and the electric conductive member are connected with each other, wherein the forming of the molded member includes:
      closing a mold receiving the sensor chip, the housing and the electric conductive member, after the pressing of the front surface of the sensor chip and the electrically connecting of the terminal; and
      injecting a molding material in the mold.

3. The method according to claim 2, wherein:
   the film is placed so as to cover: the boundary part; the sensing member; a part of the sensor chip between the boundary part and the sensing member; and the front surface of the housing.

4. The method according to claim 1, wherein:
   the inner side wall of the housing defines an in-flow portion having a capacity for receiving the part of the adhesive member pushed to the clearance.

5. The method according to claim 4, wherein:
   the adhesive member has a volume such that the part of the adhesive member pushed to the clearance flows in the in-flow portion when the front surface of the sensor chip is pressed.

6. The method according to claim 4, wherein:
   the side surface of the sensor chip includes a first side surface, a second side surface and a third side surface;
   the first and second side surfaces are opposite to each other, and are continuously connected to a first end and a second end of the third side surface, respectively;
   the third side surface is located on a terminal side;
   the inner side wall of the housing includes a first inner side wall facing the first side surface of the sensor chip and a second inner side wall facing the second side surface of the sensor chip;
   the first side surface of the sensor chip and the first inner side wall of the housing define therebetween a first clearance included in the clearance;
   the second side surface of the sensor chip and the second inner side wall of the housing define therebetween a second clearance included in the clearance; and
   the first inner side wall and the second inner side wall of the housing respectively define a first in-flow portion and a second in-flow portion included in the in-flow portion.

7. The method according to claim 6, wherein:
   the inner side wall of the housing includes a third inner side wall facing the third side surface of the sensor chip;
   the third side surface of the sensor chip and the third inner side wall of the housing define therebetween a third clearance included in the clearance; and the third inner side wall defines a third in-flow portion included in the in-flow portion.

8. The method according to claim 6, wherein:
the inner side wall of the housing includes a third inner side wall facing the third side surface of the sensor chip;
the third side surface of the sensor chip and the third inner side wall of the housing define therebetween a third clearance included in the clearance; and
the third inner side wall does not define the in-flow portion.

9. The method according to claim 1, wherein:
the sensing member of the sensor chip outputs a signal that depends on a flow amount of air; and
the pressing of the front surface of the sensor chip includes: causing the front surface of the sensor chip and the front surface of the housing to be in the same plane.

10. The method according to claim 4, wherein:
the inner side wall of the housing defines a positioning portion for positioning the sensor chip in the receive space of the housing; and
in the placing of the sensor chip in the receive space, the sensor chip is positioned with reference to the positioning portion.

11. The method according to claim 10, wherein:
the inner side wall of the housing defines, at a region between the boundary part and the in-flow portion, a throttle portion that restricts a flow of the part of the adhesive member in the clearance.

12. The method according to claim 11, wherein:
the throttle portion provides the positioning portion; and
in the placing of the sensor chip in the receive space, the sensor chip is positioned with reference to the positioning part.

13. The method according to claim 1, wherein:
the back surface of the sensor chip has a first part at an end of the sensor chip, the first part corresponding to the boundary part;
the first part of the back surface is bonded to the bonding member of the housing; and
another part of the back surface of the sensor chip other than the first part is spaced apart from the bottom of the receive space.

14. The method according to claim 1, wherein
the inner bottom surface of the housing has a second opening at a region other than the bonding member.

15. The method according to claim 1, wherein:
the adhesive member includes a thermosetting adhesive member; and
the pressing of the front surface of the sensor chip includes: heating the adhesive member to harden the adhesive member.

16. The method according to claim 1, wherein
the adhesive member has a film shape.

17. The method according to claim 1, wherein
the substrate includes a silicon substrate.

18. The method according to claim 1, wherein
In the pressing of the front surface of the sensor chip, a pressing surface of a pressing member presses the front surface of the sensor chip, the pressing surface having a resistance to attachment of the adhesive member thereto.

19. The method according to claim 18, wherein
the pressing surface is planer.

* * * * *